US010085080B2

(12) United States Patent

Bruss et al.

(10) Patent No.: US 10,085,080 B2

(45) Date of Patent: Sep. 25, 2018

(54) EARPHONE ASSEMBLIES WITH MULTIPLE SUBASSEMBLY HOUSINGS

(71) Applicant: Apple Inc., Cupertino, CA (US)

(72) Inventors: John Bruss, Culver City, CA (US); Robert A. Boyd, Los Angeles, CA (US); Carlos M. Santana, Granada Hills, CA (US); Vijay Koneru, Los Angeles, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/696,525

(22) Filed: Sep. 6, 2017

(65) Prior Publication Data

US 2018/0070164 A1 Mar. 8, 2018

Related U.S. Application Data

(60) Provisional application No. 62/384,156, filed on Sep. 6, 2016.

(51) Int. Cl.

| | |
|---|---|
| ***H04R 1/10*** | (2006.01) |
| ***H01R 12/57*** | (2011.01) |
| ***H01R 12/53*** | (2011.01) |
| ***H01R 43/20*** | (2006.01) |
| ***H05K 5/00*** | (2006.01) |
| ***H01H 13/50*** | (2006.01) |

(52) U.S. Cl.

CPC ........... *H04R 1/1016* (2013.01); *H01H 13/50* (2013.01); *H01R 12/53* (2013.01); *H01R 12/57* (2013.01); *H01R 43/205* (2013.01); *H04R 1/1033* (2013.01); *H04R 1/1041* (2013.01); *H05K 5/0017* (2013.01); *H04R 2420/07* (2013.01)

(58) Field of Classification Search

CPC .............................. H04R 1/1033; H01R 12/53

USPC ........................................................... 381/74

See application file for complete search history.

(56) References Cited

U.S. PATENT DOCUMENTS

| | | | | |
|---|---|---|---|---|
| 2007/0003093 A1* | 1/2007 | Ito | H04R 1/1066 | 381/378 |
| 2010/0104126 A1* | 4/2010 | Greene | H01B 7/225 | 381/384 |
| 2010/0111349 A1* | 5/2010 | Devlas | H04R 1/1033 | 381/380 |
| 2011/0170703 A1* | 7/2011 | Palma | H04R 1/1041 | 381/74 |
| 2016/0126659 A1* | 5/2016 | Kim | H01R 13/504 | 439/37 |
| 2016/0366506 A1* | 12/2016 | Kim | H04R 5/0335 | |
| 2017/0353781 A1* | 12/2017 | Choi | H04R 1/1016 | |
| 2017/0374445 A1* | 12/2017 | Choi | H04R 1/1033 | |

* cited by examiner

*Primary Examiner* — David Ton

(74) *Attorney, Agent, or Firm* — Van Court & Aldridge LLP

(57) ABSTRACT

Earphone assemblies with multiple subassembly housings are provided.

20 Claims, 34 Drawing Sheets

EARPHONE ASSEMBLIES WITH MULTIPLE SUBASSEMBLY HOUSINGS

CROSS-REFERENCE TO RELATED APPLICATION(S)

This application claims the benefit of prior filed U.S. Provisional Patent Application No. 62/384,156, filed Sep. 6, 2016, which is hereby incorporated by reference herein in its entirety.

TECHNICAL FIELD

This can relate to earphone assemblies, including earphone assemblies with multiple subassembly housings.

BACKGROUND OF THE DISCLOSURE

Earphone assemblies are often worn by users that are exercising or performing other activities. However, such active use often makes user interaction with an earphone assembly difficult or cumbersome.

SUMMARY OF THE DISCLOSURE

Earphone assemblies with multiple subassembly housings are provided.

For example, an earphone assembly to be worn by a user's ear is provided that may include a housing structure including a rear housing structure portion, a front housing structure portion, and a nozzle housing structure portion extending out from the front housing structure portion about a sound axis and defining an inner nozzle space, and an audio output component positioned at least partially within an interior housing space that is at least partially defined by the rear housing structure portion and the front housing structure portion and that is communicatively coupled to the inner nozzle space, such that an audio opening of the audio output component is aligned with the sound axis and is operative to emit sound waves from the audio output component, along the sound axis, through a portion of a front chamber of the interior housing space and through the nozzle housing structure portion.

As another example, an electronic assembly to be worn about a user's neck is provided that may include a first subassembly including a first housing defining a first internal space, a first electronic component positioned at least partially within the first internal space, and a first joint component coupled to the first housing, a second subassembly including a second housing defining a second internal space, a second electronic component positioned at least partially within the second internal space, and a second joint component coupled to the second housing, and a cable assembly including an electrical conductor extending between a first electrical conductor end and a second electrical conductor end, and a memory cable component extending between a first memory cable component end and a second memory cable component end, wherein the first electrical conductor end is electrically coupled to the first electronic component within the first internal space, wherein the first memory cable component end is coupled to the first joint component, wherein the second electrical conductor end is electrically coupled to the second electronic component within the second internal space, wherein the second memory cable component end is coupled to the second joint component, and wherein at least a portion of the memory cable component is configured to define a curved shape between the first memory cable component end and the second memory cable component end absent any external force applied to the headset assembly.

As yet another example, an input assembly is provided that may include a top housing including a top housing opening, a circuit board including a switch on a top surface of the circuit board, a cover positioned between the top housing and the top surface of the circuit board, and a button held between the cover and the top housing, wherein a portion of the button is exposed through the top housing opening, wherein the cover includes an outer cover structure provided by an outer cover structure material and including an outer cover structure opening, and an inner cover structure provided by an inner cover structure material within and across the outer cover structure opening, wherein the inner cover structure material is softer than the outer cover structure material, and wherein, when the portion of the button is pushed down through the top housing opening, the button pushes against the inner cover structure to actuate the switch.

This Summary is provided only to summarize some example embodiments, so as to provide a basic understanding of some aspects of the subject matter described in this document. Accordingly, it will be appreciated that the features described in this Summary are only examples and should not be construed to narrow the scope or spirit of the subject matter described herein in any way. Unless otherwise stated, features described in the context of one example may be combined or used with features described in the context of one or more other examples. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters refer to like parts throughout, and in which.

DETAILED DESCRIPTION OF THE DISCLOSURE

Earphone assemblies with multiple subassembly housings are provided and described with reference to FIGS. 1-16H.

Any suitable type of earbud subassembly or earbud subassemblies may be provided by an earphone assembly of the disclosure. For example, an earphone assembly may include one or more occluding earbuds or earphones configured to be at least partially inserted into an ear canal of a user (e.g., an in-ear headphone or in-ear monitor or canalphone assembly) (see, e.g., earbud subassembly 200 and/or earbud subassembly 300 of earphone assembly 100 of FIGS. 1-5). Alternatively, an earphone assembly may include one or more non-occluding earbuds or earphones configured not to be at least partially inserted into the ear canal of the user but that may fit directly in the outer ear of the user (e.g., within a concha of the ear) and face the ear canal. A wingtip (not shown) that may be operative to anchor to a portion of a user's ear (e.g., the anti-helix crus of the ear) may be removably coupled to an earbud subassembly of an earphone assembly, such that the wingtip may only be used when desired and/or such that different wingtips of different sizes may be interchangeably coupled to an earbud of an earphone assembly based on the size of the user's ear. Alternatively, such a wingtip may be an integral part of an earphone assembly, such as a wingtip that is molded to or otherwise fixed to an earbud or other portion of the earphone assembly.

Figure 1:
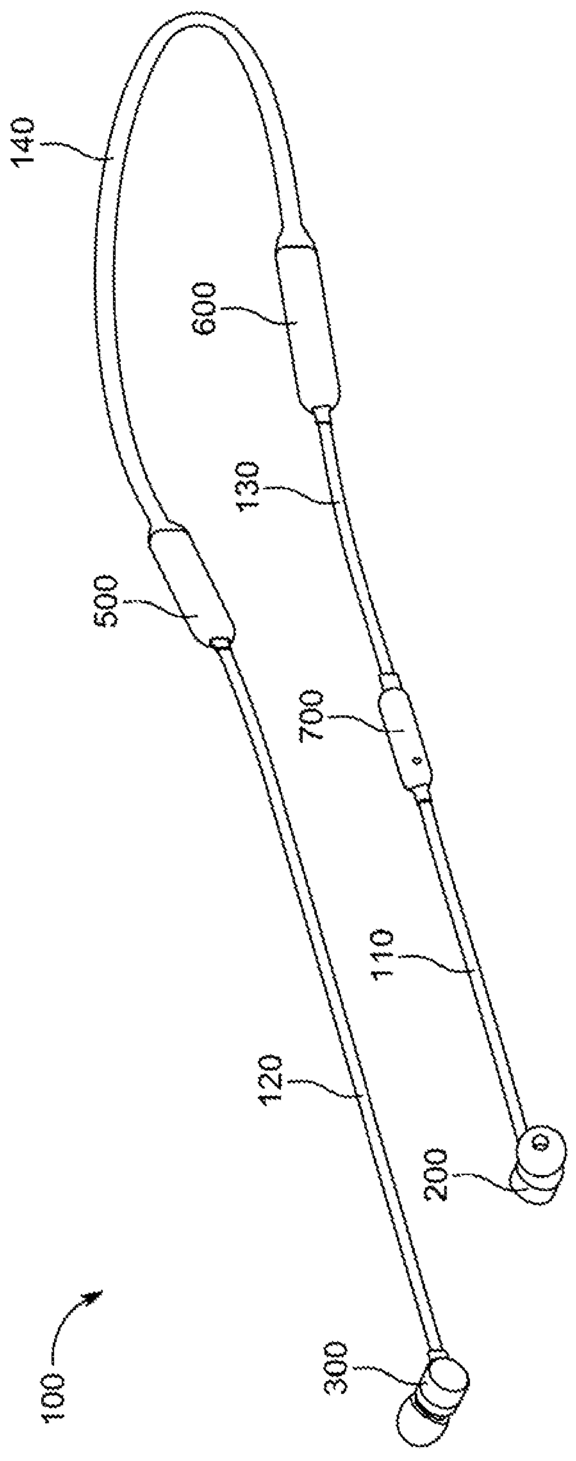
FIG. 1 is a perspective view of an illustrative earphone assembly.
Figure 1B:
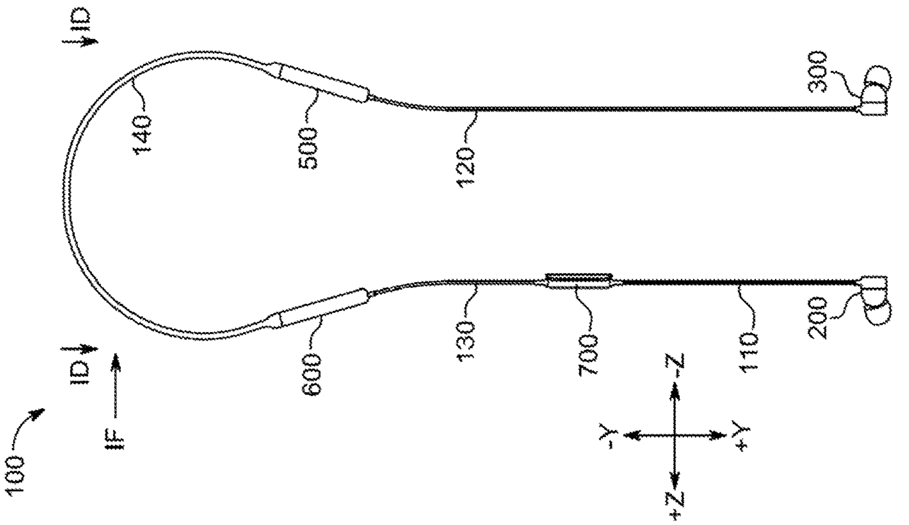
FIG. 1B is a bottom view of the earphone assembly of FIGS. 1 and 1A.
Figure 1A:
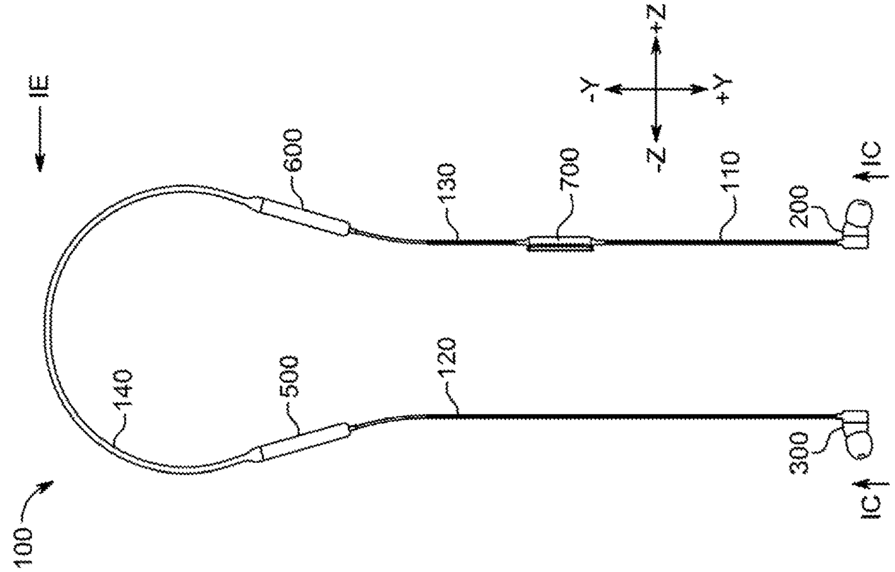
FIG. 1A is a top view of the earphone assembly of FIG. 1.
Figure 1D:
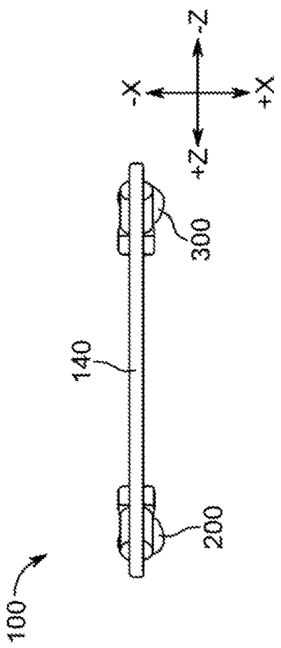
FIG. 1D is a rear view of the earphone assembly of FIGS. 1-1C, taken from line ID-ID of FIG. 1C.
Figure 1C:
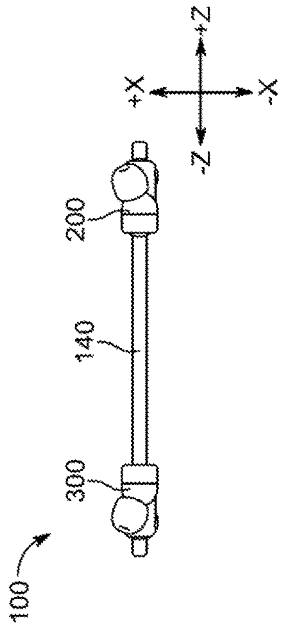
FIG. 1C is a front view of the earphone assembly of FIGS. 1-1B, taken from line IC-IC of FIG. 1A.
Figure 1E:
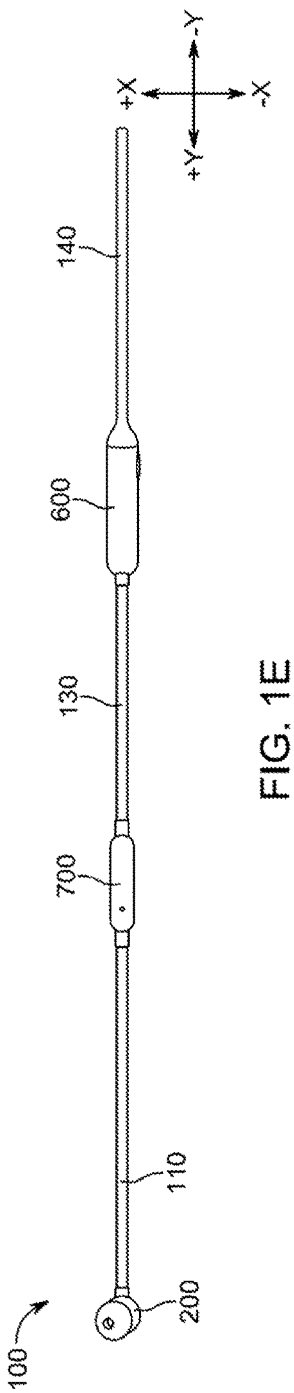
FIG. 1E is a left side view of the earphone assembly of FIGS. 1-1D, taken from line IE-IE of FIG. 1A.
Figure 1F:
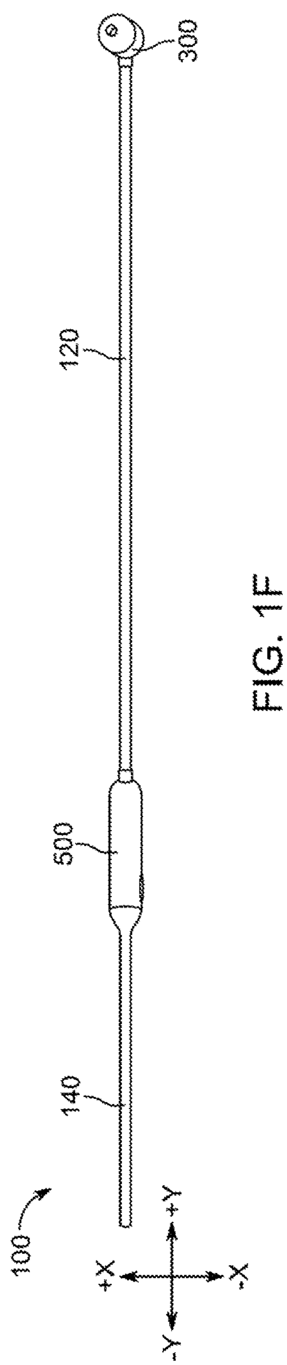
FIG. 1F is a right side view of the earphone assembly of FIGS. 1-1E, taken from line IF-IF of FIG. 1B.
Figure 2:
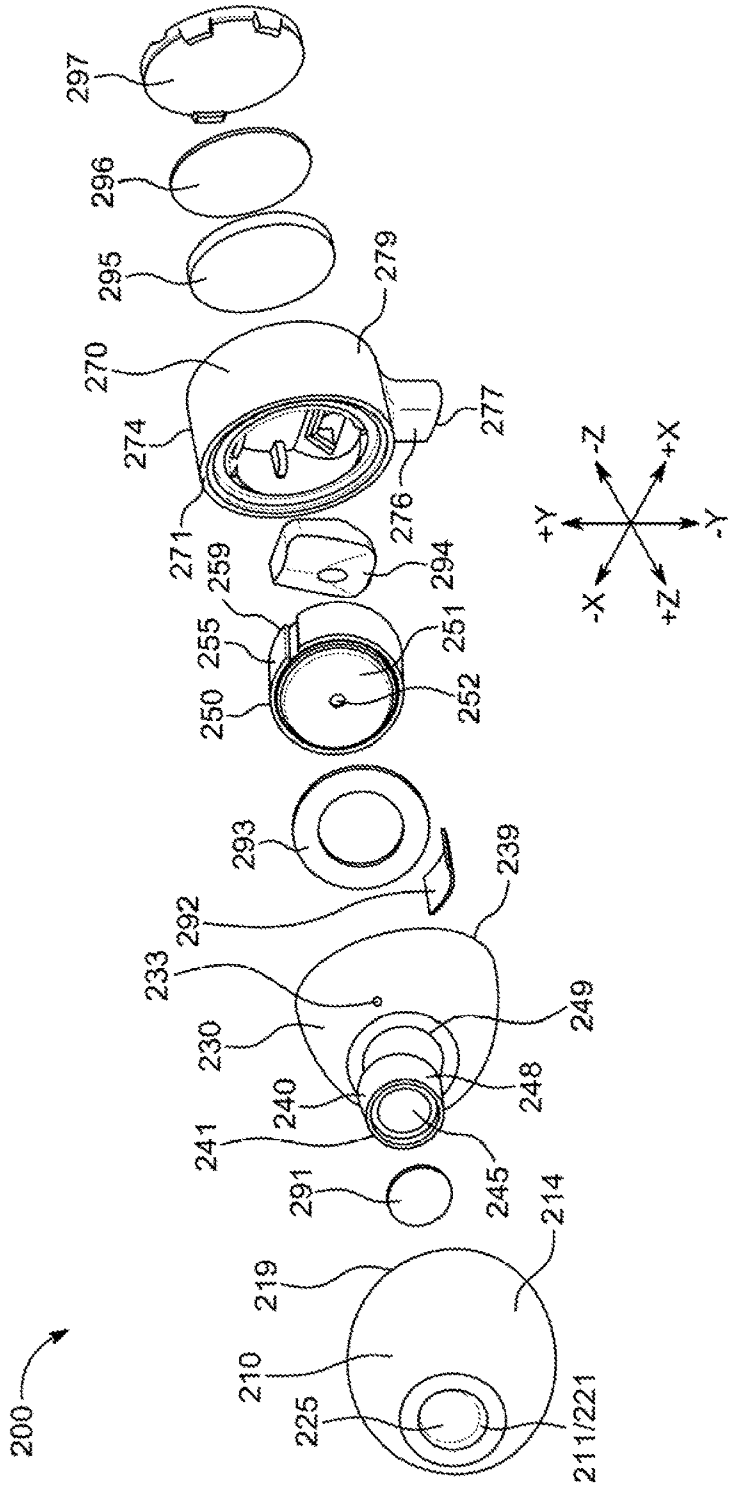
FIG. 2 is an exploded perspective view of an earbud subassembly of the earphone assembly of FIGS. 1-1F.

As shown in FIGS. 1-1F, an earphone assembly 100 may include a first earbud subassembly 200, a second earbud subassembly 300, a power supply subassembly 500, a logic subassembly 600, an input subassembly 700, and various cable subassemblies that may electrically couple the other subassemblies of earphone assembly 100, such as a first cable subassembly 110 that may electrically couple earbud subassembly 200 with input subassembly 700, a second cable subassembly 120 that may electrically couple earbud subassembly 300 with power supply subassembly 500, a third cable subassembly 130 that may electrically couple input subassembly 700 with logic subassembly 600, and a fourth cable subassembly 140 that may electrically couple power supply subassembly 500 with logic subassembly 600. Each one of first earbud subassembly 200 and second earbud subassembly 300 may be operative to receive audio data electrical signals (e.g., from cable subassembly 110 and cable subassembly 120, respectively), to convert or transduce the received electrical signals into corresponding sound waves, and to emit the sound waves towards an eardrum of a user wearing the earbud subassembly. First earbud subassembly 200 and second earbud subassembly 300 may be substantially the same in function, shape, and/or size, but may be mirror images of one another, such that each may be configured for comfortable use within a respective one of a user's left and right ears, where, for example, first earbud subassembly 200 may be configured for use in a user's left ear and second earbud subassembly 300 may be configured for use in a user's right ear, while the various cable subassemblies 110, 120, 130, and 140 in combination with subassemblies 500, 600, and 700 may together physically couple earbud subassemblies 200 and 300 and may together be worn around a backside of a neck of the user or under the chin of the user or over the head of the user or in any other suitable fashion when subassemblies 200 and 300 are worn by the user's ears.

Power supply or battery subassembly 500 may include a battery or any other suitable power supply operative to receive and store power that may then be used to power various other subassemblies of assembly 100, where such power may be shared with one or more of subassemblies 200, 300, 600, and/or 700 via one or more of cable subassemblies 110, 120, 130, and/or 140. The power supply may be rechargeable via a charging port of assembly 100 (e.g., a charging port of power supply subassembly 500 and/or of logic subassembly 600) and/or may be replaceable. Power supply subassembly 500 may include a power button that may be used to turn assembly 100 on and off. Logic or main logic board ("MLB") subassembly 600 may include any suitable components for controlling the functionality of assembly 100, such as, but not limited to, a processor component, a memory component, a wireless communication component for receiving audio data information from a media player or radio source, a wired connector for connecting via a cable with a media player (not shown), a media player application if no remote media source is to be used, a charging port for the power supply of power supply assembly 500, and/or the like, each of which may be at least partially provided on an MLB. Input or user communication box subassembly 700 may include any suitable components for receiving user input commands for controlling assembly 100, such as, but not limited to, a microphone, one or more buttons that may be configured to receive user input for controlling volume and/or media selection, and/or the like. In some embodiments, assembly 100 may include other components not combined or included in those shown or several instances of the components shown.

As shown in one or more of FIGS. 2-5, earbud subassembly (hereinafter "earbud") 200 may include various components for receiving and transducing audio data electrical signals into corresponding sound waves as well as various components for maintaining a functional position within a user's outer ear and emitting the sound waves towards an eardrum of a user when worn by the user in the functional position. For example, earbud 200 may include an eartip 210, a front housing 230, a sound emitting subassembly or driver or transducer 250, a rear housing 270, and a wingtip subassembly 400. Front housing 230 and rear housing 270 may be operative to be coupled to one another to define an interior housing space within which at least a portion of sound emitting subassembly 250 may be held. An adhesive and/or mechanical snap-fit features and/or any other suitable coupling technique(s) may be used to hold front housing 230 and rear housing 270 together (e.g., to hold rear face 239 of front housing 230 to front face 271 of rear housing 270) and/or to hold sound emitting subassembly 250 to one or both of front housing 230 and rear housing 270. Earbud 200 may include a transducer adhesive 293 that may be operative to adhere to both a front face 251 of sound emitting subassembly 250 and to a rear face of front housing 230. Moreover, front housing 230 and rear housing 270 may be operative to communicatively couple a portion of front face 251 of sound emitting subassembly 250 to an inner eartip space 225 extending between a rear end opening 229 and a front end opening 221 of an inner eartip member 220 of eartip 210. For example, when held between front housing 230 and rear housing 270, an audio opening 252 provided through front face 251 of sound emitting subassembly 250 for emitting sound waves from sound emitting subassembly 250 (e.g., from a diaphragm and/or membrane 254 of subassembly 250 (see, e.g., FIG. 6)) may be communicatively aligned with a sound axis S that may also be aligned with an inner nozzle space 245 extending between a rear end opening 249 and a front end opening 241 of a nozzle member 240 of front housing 230 and that also may be aligned with inner eartip space 225 of inner eartip member 220, where such alignment may be operative to optimize treble response (e.g., such that sound may be emitted from audio opening 252, along sound axis S, through a portion of the interior housing space that may be defined by front housing 230 and rear housing 270 when coupled to one another (e.g., a portion of a front chamber 253), and through inner nozzle space 245). One or more mating features 228 along an outer surface of inner eartip member 220 may be operative to removably or fixedly mate with one or more mating features 248 along an inner surface of nozzle member 240 for communicatively coupling inner eartip space 225 defined by inner eartip member 220 of eartip 210 with inner nozzle space 245 defined by nozzle member 240 of front housing 230, such that sound waves emitted from sound emitting subassembly 250 (e.g., from audio opening 252) may be carried along a sound path (e.g., in the +S direction along sound axis S) through rear end opening 249 of nozzle member 240, along both inner nozzle space 245 and inner eartip space 225, and then out from front end opening 221 of inner eartip member 220 of eartip 210. Nozzle member 240 may have any suitable geometry. For example, an internal cross-sectional diameter or dimension of front end opening 241 and/or of rear end opening 249 of nozzle member 240 may be configured to have any suitable magnitude, such as in a range between 2.21 millimeters and 4.10 millimeters or about 3.15 millimeters, while a length of nozzle member 240 between openings 241 and 249 may be configured to have any suitable magnitude, such as in a range between 3.36 millimeters and 6.24 millimeters or about 4.80 millimeters. Any suitable filter or mesh 291 may be provided along or across the sound path, such as over front end opening 241 of nozzle member 240, for enabling sound to pass therethrough and out from eartip 210 while preventing debris (e.g., dust and/or liquids) to pass therethrough and into inner nozzle space 245.

Eartip 210 may be operative to provide a comfortable fit for earbud 200 at least partially within an ear canal of a user and/or to form an acoustic seal between earbud 200 and the ear canal and/or to pass sound through the ear canal via front end opening 221 when earphone assembly 100 is worn by the user. For example, an external eartip structure 214 of eartip 210 may extend from a front end opening 211 (e.g., at front end opening 221 of inner eartip member 220) rearwards to a rear end opening 219 that may surround a portion of front housing 230 (e.g., nozzle member 240) to define an outer eartip space 215 between an internal surface of external eartip structure 214 and an external surface of inner eartip member 220, such that external eartip structure 214 may be deformable to fit within any suitable portion of a user's ear, such as an ear canal for forming the acoustic seal between earbud 200 and the user's ear. A front vent opening 233 may be provided through front housing 230 for enabling pressure relief of a front chamber 253 that may be defined by a space between front face 251 of sound emitting subassembly 250 and a portion of front housing 230 and a portion of eartip 210 and that may channel sound emitted from audio opening 252 of sound emitting subassembly 250 through front end opening 211/221 of eartip 210 (e.g., front chamber 253 may be a portion of the interior housing space that may be defined by front housing 230 and rear housing 270 when coupled to one another). A rear face of front housing 230 may be coupled to front face 251 of sound emitting subassembly 250 about audio opening 252 (e.g., by transducer adhesive 293) to define a rear boundary of front chamber 253 along front face 251, where that rear boundary may have any suitable geometry, such as a circular shape with a diameter having any suitable magnitude, such as in a range between 3.36 millimeters and 6.24 millimeters or about 4.80 millimeters, while a distance along axis S between that rear boundary and front end opening 241 of nozzle member 240 may have any suitable magnitude, such as in a range between 4.54 millimeters and 8.44 millimeters or about 6.49 millimeters. Front vent opening 233 may be positioned so as not be covered or otherwise blocked by external eartip structure 214 or any other portion of eartip 210 when earbud 200 is held by a user's ear, yet eartip structure 214 may be operative to obfuscate or hide at least a portion of opening 233 (e.g., in a shadow of structure 214 on front housing 230) for cosmetic purposes or the size of an external opening of opening 233 may not be easily viewable by the naked eye. A rear vent opening 237 may be provided through front housing 230 for enabling pressure relief of a rear chamber 257 that may be defined by a space between a side face 255 and/or a rear face 259 of sound emitting subassembly 250 and a portion of front housing 230 and a portion of rear housing 270. Any suitable filter or mesh 292 may be provided along the pressure relief path of rear vent opening 237, such as over opening 237 and against an internal surface of front housing 230 between front housing 230 and sound emitting subassembly 250, for enabling sound or other suitable air to pass therethrough and out from rear chamber 257 via opening 237 while preventing debris (e.g., dust and/or liquids) to pass therethrough and into rear chamber 257.

Figure 3:
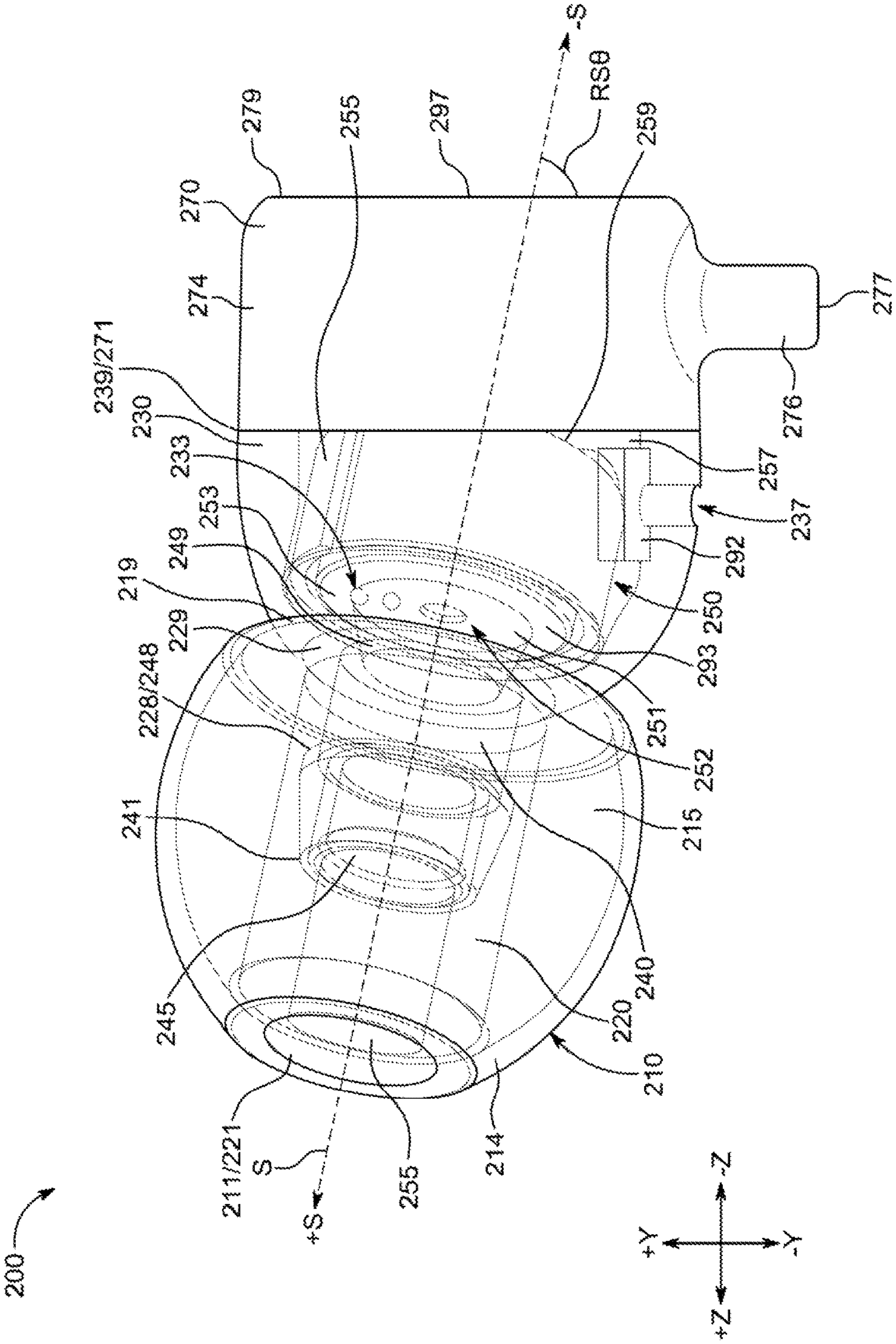
FIG. 3 is a side elevational view of the earbud subassembly of FIGS. 1-2 with portions of the earbud subassembly partially transparent.
Figure 4:
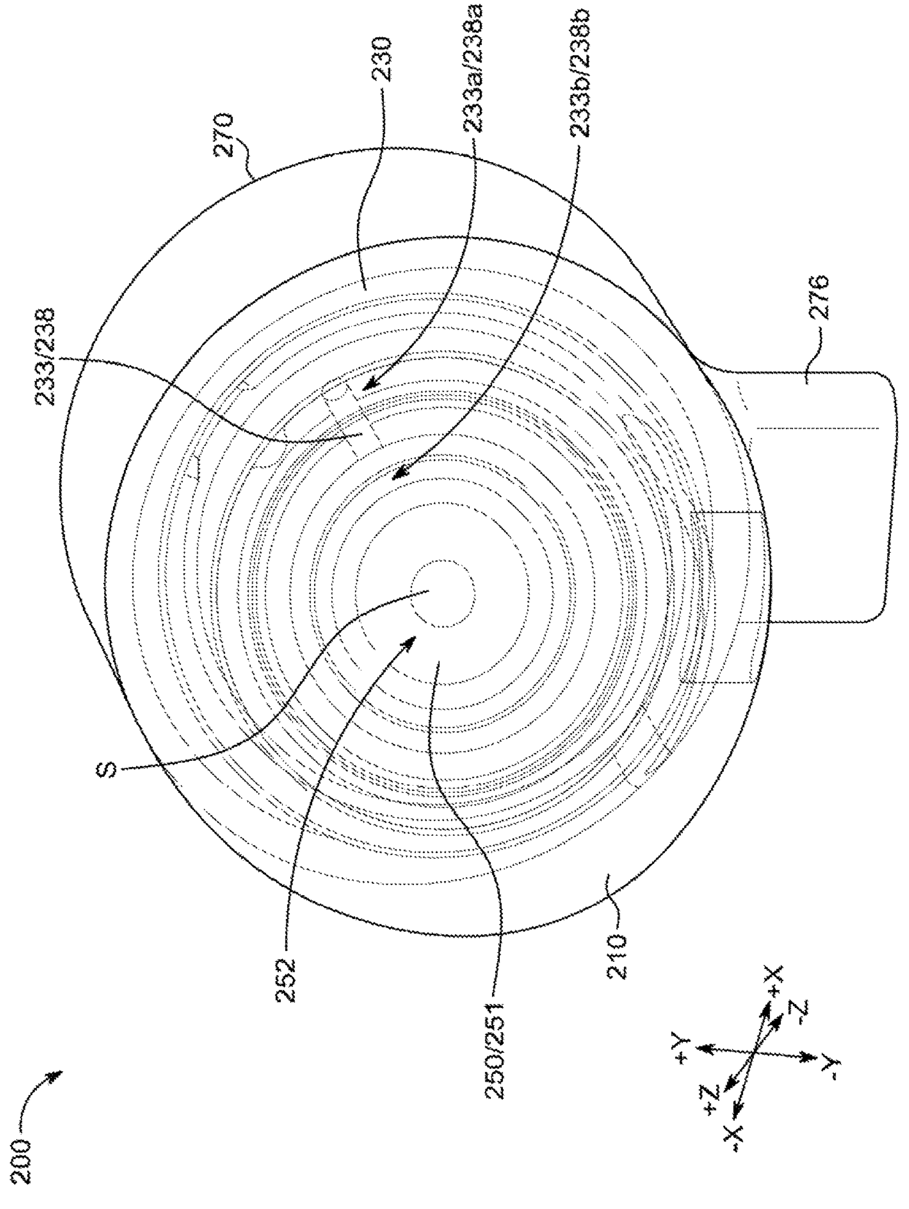
FIG. 4 is another perspective view of the earbud subassembly of FIGS. 1-3 with portions of the earbud subassembly partially transparent.

Rear housing 270 may include a cable opening 277 through which a portion of cable subassembly 110 may pass, such that an end of one or more conductors at an end of cable subassembly 110 (not shown) may be positioned within earbud 200 (e.g., within rear chamber 257 defined by rear housing 270) in order to be electrically coupled to one or more respective contacts of sound emitting subassembly 250. For example, as shown, cable opening 277 may be provided at a bottom end of a cable external strain relief structure 276 of rear housing 270 that may extend from a side structure 274 of rear housing 270 extending between front face 271 and rear face 279 of rear housing 270. Earbud 200 may also include an internal strain relief structure 294 that may be coupled to rear housing 270 for protecting at least a portion of the physical coupling between cable subassembly 110 and earbud 200 (e.g., to provide additional strain relief to that connection). A magnet 295 may be positioned against rear face 279 of rear housing 270 by any suitable mechanism(s), such as by an adhesive 296, and/or by a rear plate 297 that may be coupled to rear face 279 of rear housing 270. A complimentary magnet may be provided at a similar position on earbud 300, such that the magnets may magnetically hold earbud 200 and earbud 300 together when they are not in use (e.g., when earbuds 200 and 300 are not positioned within a user's ears), which may prevent the cable subassemblies of earphone assembly 100 from becoming tangled and/or may keep earphone assembly 100 compact. As shown in FIG. 3, for example, an X-Y plane that may include rear plate 297 and/or rear face 279 of rear housing 270 may form a rear sound angle RSθ (e.g., acute angle) with sound axis S (e.g., the axis along which nozzle member 240 may extend), where such a rear sound angle RSθ may be any suitable angle, such as in a range between 47° and 87° or about 67°. In other embodiments, axis S may be perpendicular to rear face 279 such that rear sound angle RSθ may be 90°.

Figure 5:
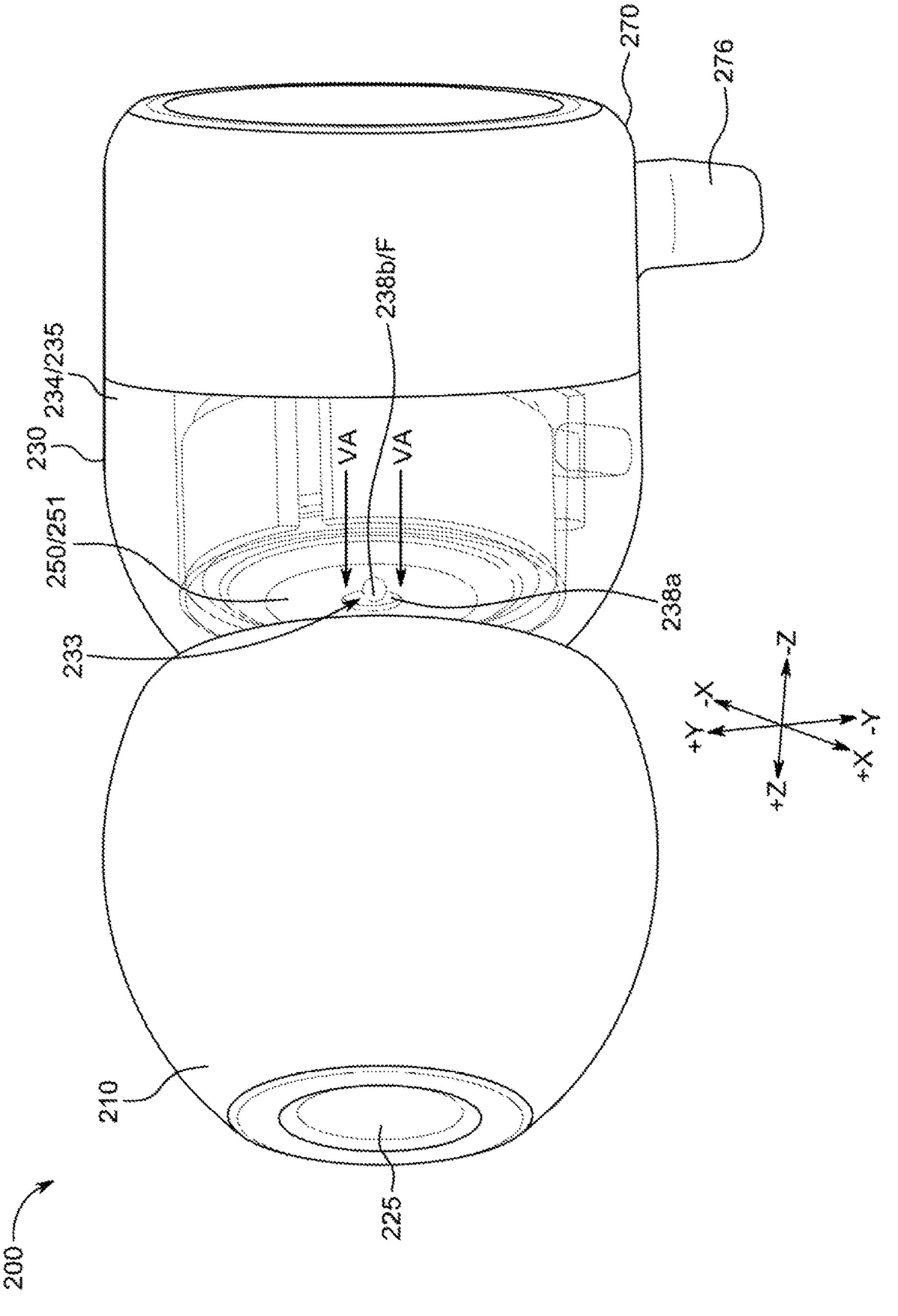
FIG. 5 is yet another perspective view of the earbud subassembly of FIGS. 1-4 with portions of the earbud subassembly partially transparent.
Figure 5A:
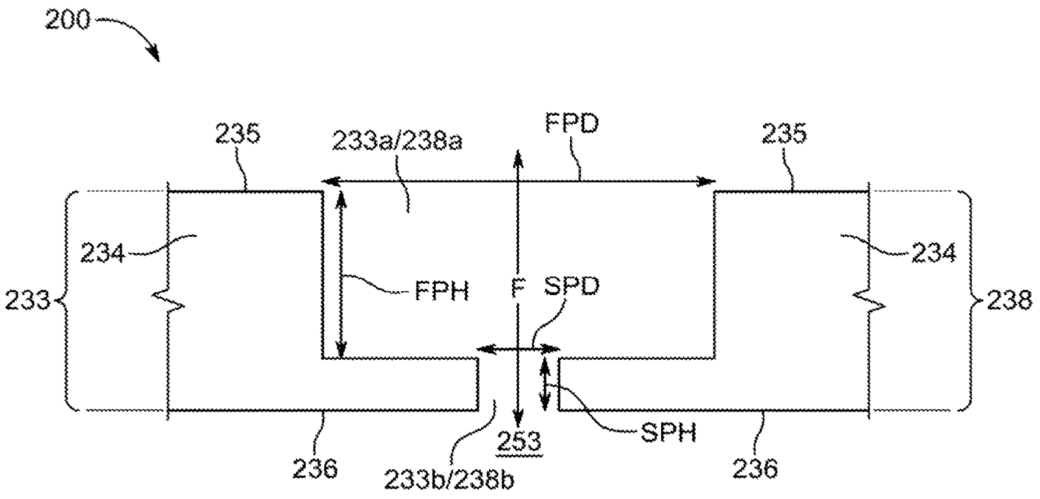
FIG. 5A is a cross-sectional view of the earbud subassembly of FIGS. 1-5 taken from line VA-VA of FIG. 5.

As shown in FIGS. 2-5A, front housing 230 may include a front housing structure 234 that may extend rearwardly from rear end opening 249 of nozzle member 240 to rear face 239 of front housing 230. Front housing structure 234 may include an exterior surface 235 and an opposite interior surface 236 that may define a portion of front chamber 253, while front vent opening 233 may be provided by a passageway extending through structure 234, including through both exterior surface 235 and interior surface 236. As shown in FIG. 5A, for example, front vent opening 233 may be provided by a passageway 238 including a first passageway portion **238*a* and a second passageway portion 238*b*. In some embodiments, first passageway portion 238*a* may be provided by a notch or indentation into front housing structure 234 at exterior surface 235 to define an exterior opening 233*a* of front vent opening 233, while second passageway portion 238*b* may be provided by any suitable hollow into front housing structure 234 at interior surface 236 to define an interior opening 233*b* of front vent opening 233. First passageway portion 238*a* may be any suitable shape and size, such as cylindrical with a cross-sectional diameter or dimension FPD and a height FPH only partially through structure 234 towards interior surface 236, while second passageway portion 238*b* may be any suitable shape and size, such as cylindrical with a cross-sectional or dimension SPD and a height SPH only partially through structure 234 towards exterior surface 235 that joins first passageway portion 238*a*, and where each one of passageway portions 238*a* and 238*b* may be centered about a front vent axis F (e.g., each one of cross-sectional dimension FPD of portion 238*a* and cross-sectional dimension SPD of portion 238*b*** may be perpendicular to and/or centered about axis F).

Each passageway portion may have any suitable geometry. For example, cross-sectional diameter or dimension FPD of first passageway portion **238*a* may be configured to have any suitable magnitude, such as in a range between 0.35 millimeters and 0.65 millimeters or about 0.50 millimeters, height FPH of first passageway portion 238*a* may be configured to have any suitable magnitude, such as in a range between 1.015 millimeters and 1.885 millimeters or about 1.450 millimeters, cross-sectional diameter or dimension SPD of second passageway portion 238*b* may be configured to have any suitable magnitude, such as in a range between 0.02 millimeters and 0.10 millimeters or about 0.05 millimeters (e.g., to prevent water entry but enable airflow through passageway portion 238*b*), and height SPH of second passageway portion 238*b* may be configured to have any suitable magnitude, such as in a range between 0.28 millimeters and 0.52 millimeters or about 0.40 millimeters. Passageway portions 238*a* and 238*b* may be formed in any suitable manner(s) for providing front vent opening 233. For example, in some embodiments, first passageway portion 238*a* may be formed during a molding process for forming at least structure 234 if not also other portions or the entirety of front housing 230 (e.g., a molding process using polybutylene terephthalate ("PBT") and/or polycarbonate ("PC") and/or any other suitable thermoplastic polymer(s) for providing structure 234 and/or otherwise of front housing 230), while second passageway portion 238*b* may then be formed by laser drilling second passageway portion 238*b* through a remaining thickness SPH of structure 234. While first passageway portion 238*a* may be shown provided through exterior surface 235 of structure 234 and while second passageway portion 238*b* may be shown provided through interior surface 236 of structure 234, in other embodiments first passageway portion 238*a* may be provided through interior surface 236 of structure 234 while second passageway portion 238*b* may be provided through exterior surface 235 of structure 234. Although only one second passageway portion 238*b* may be shown, multiple second passageway portions 238*b* may be provided through structure 234 at a single first passageway portion 238*a* (e.g., along a circular path that may mimic the cross-sectional shape of first passageway portion 238*a*), or multiple first passageway portions 238*a* may be provided at different portions of structure 234 and one or more second passageway portions 238*b* may be provided at each first passageway portion 238*a*. Front vent opening 233 may be provided through structure 234 of front housing 230 for enabling pressure relief of front chamber 253 that may be defined by a space between front face 251 of sound emitting subassembly 250 and a portion of front housing 230 and a portion of eartip 210 and that may channel sound emitted from audio opening 252 of sound emitting subassembly 250 through front end opening 211/221 of eartip 210**.

As mentioned, front vent opening 233 may prevent pressure build up on the ear (e.g., ear drum) of the user during use of earbud 200 and/or may prevent certain distortion of certain components of sound emitting subassembly 250 (e.g., deformation of diaphragm and/or membrane 254 of subassembly 250 (see, e.g., FIG. 6)) and/or generation of certain crackling sounds during use and/or when earbud 200 is positioned within or removed from the user's ear. Cross-sectional diameter or dimension SPD of second passageway portion **238*b* may be small enough to prevent water passing therethrough and/or to avoid negatively affecting the sound emitted by sound emitting subassembly 250 (e.g., such that deep bass sound waves (e.g., down to and/or below 20 hertz) may be perfectly reproduced for the user as if front vent opening 233 was not present). By providing second passageway portion 238*b* through a reduced thickness portion of structure 234 (e.g., due to first passageway portion 238*a*), the magnitude of height SPH of second passageway portion 238*b* may be reduced, which may tune the frequency response of earbud 200** accordingly.

Figure 6:
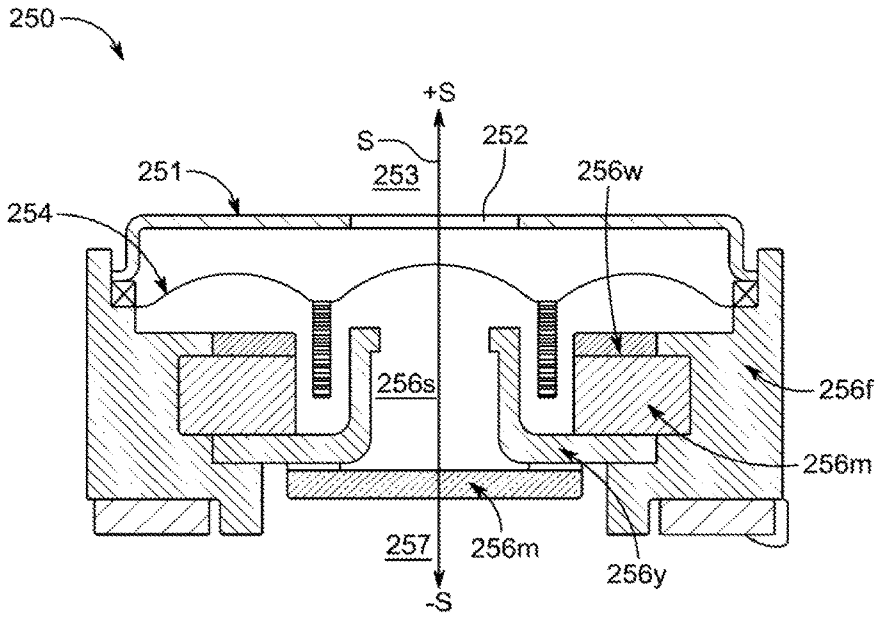
FIG. 6 is a cross-sectional view of an illustrative sound emitting subassembly of the earbud subassembly of FIGS. 1-5.

Sound emitting subassembly 250 may provide any suitable transducer or driver that may be operative to receive audio data electrical signals (e.g., from cable subassembly 110), to convert or transduce the received electrical signals into corresponding sound waves, and to emit the sound waves (e.g., in the +S direction along sound axis S) towards an eardrum of a user wearing earbud subassembly 200. As shown in FIG. 6, sound emitting subassembly 250 may include a flexible diaphragm or membrane 254 that may be coupled at an outer periphery to a frame **256*f* and may include a former at one or more intermediate positions with a moving coil 256*c* coupled thereto. A permanent magnet 256*m* may be positioned about moving coil 256*c*, for example, using frame 256*f*, at least one washer 256*w*, and a t-yoke 256*y*. The audio data electrical signals may be passed through coil 256*c* so as to generate an electromagnetic field that may produce and electromagnetic force that may be opposed by the main permanent magnetic field generated by permanent magnet 256*m* such that coil 256*c* may move membrane 254, which may cause a disturbance in the air around membrane 254 for producing sound waves. At least some of these sound waves may be emitted through audio opening 252 that may be provided through a cover structure or front face 251, which may also be coupled at an outer periphery to frame 256*f*, and which may be operative to protect at least a portion of membrane 254. Therefore, membrane 254 may be operative to move in a magnetic gap for vibrating and producing sound waves. Membrane 254 may be any suitable shape and size, but may be a thin, semi-rigid but flexible structure. In some particular embodiments, membrane 254 may be a laminate or other suitable combination of multiple layers or films of materials stacked on top of one another to provide a composite structure that may be operative to provide or otherwise enable the tonality desired for sound emitting subassembly 250 to generate a target sound. For example, membrane 254 may include a first layer of material including any suitable polyurethane ("PU") (e.g., any suitable PU elastomer) and a second layer of material including any suitable polyarylate ("PAR") (e.g., [-φ-C(CH3)2-φ-CO2-φ-CO2-]n, amorphous polyester of bisphenol-A with isophthalic and terephthalic acids, etc.). Either one of such a first layer and such a second layer may be a top-most layer of membrane 254 closest to cover 251 and/or where either one of such a first layer and such a second layer may be a bottom-most layer of membrane 254 closest to a driver space 256*s* within sound emitting subassembly 250 that may be covered at a rear end by a mesh 256*m*. Membrane 254** may include one of each of such first and second layers or membrane may include multiple ones of one or each of such first and second layer types in any suitable stacking order.

Figure 7:
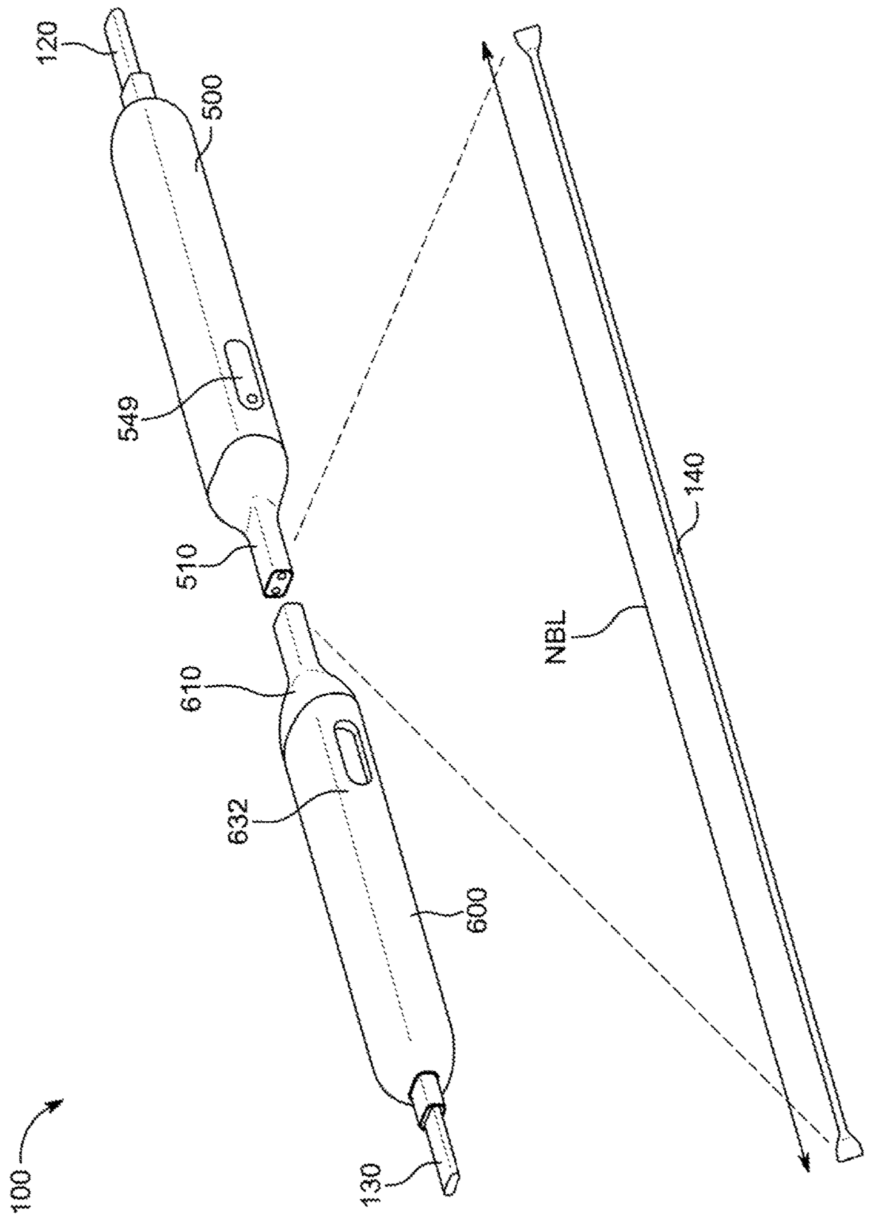
FIG. 7 is a perspective view a neckband subassembly of the earphone assembly of FIGS. 1-1F.

Cable subassembly 140 may electrically couple power supply subassembly 500 with logic subassembly 600 and, in some embodiments, may be operative to maintain or hold or at least return to a curved shape (e.g., when no external forces are applied thereto (e.g., at least when no external forces are applied to assembly 100)) such that cable subassembly 140 may be positioned to wrap around the back of a user's neck when earbuds 200 and 300 are worn in the user's ears. As shown in FIG. 7, for example, cable subassembly 140 (hereinafter "neckband" subassembly 140) may be any suitable length NBL, such as in a range between 197 millimeters and 365 millimeters or about 281 millimeters, between a power neckband housing portion 510 of power supply assembly 500 and a logic neckband housing portion 610 of logic subassembly 600 and may have any suitable curved shape (e.g., any suitable spline that may approximate a radius of curvature of about 53 millimeters), as shown in FIG. 1. In some embodiments, it is to be understood that portions of assembly 100, such as neckband assembly 140 and subassemblies 500 and 600, may be provided in another type of assembly other than an earphone assembly, such as any suitable headset assembly (e.g., with any suitable display and/or microphone and/or earphone components), where neckband assembly 140 may be positioned to wrap around the back of a user's neck when any other portion of the headset assembly is worn by the user (e.g., a headset display is positioned functionally with respect to one or more of the user's eyes).

Figure 8:
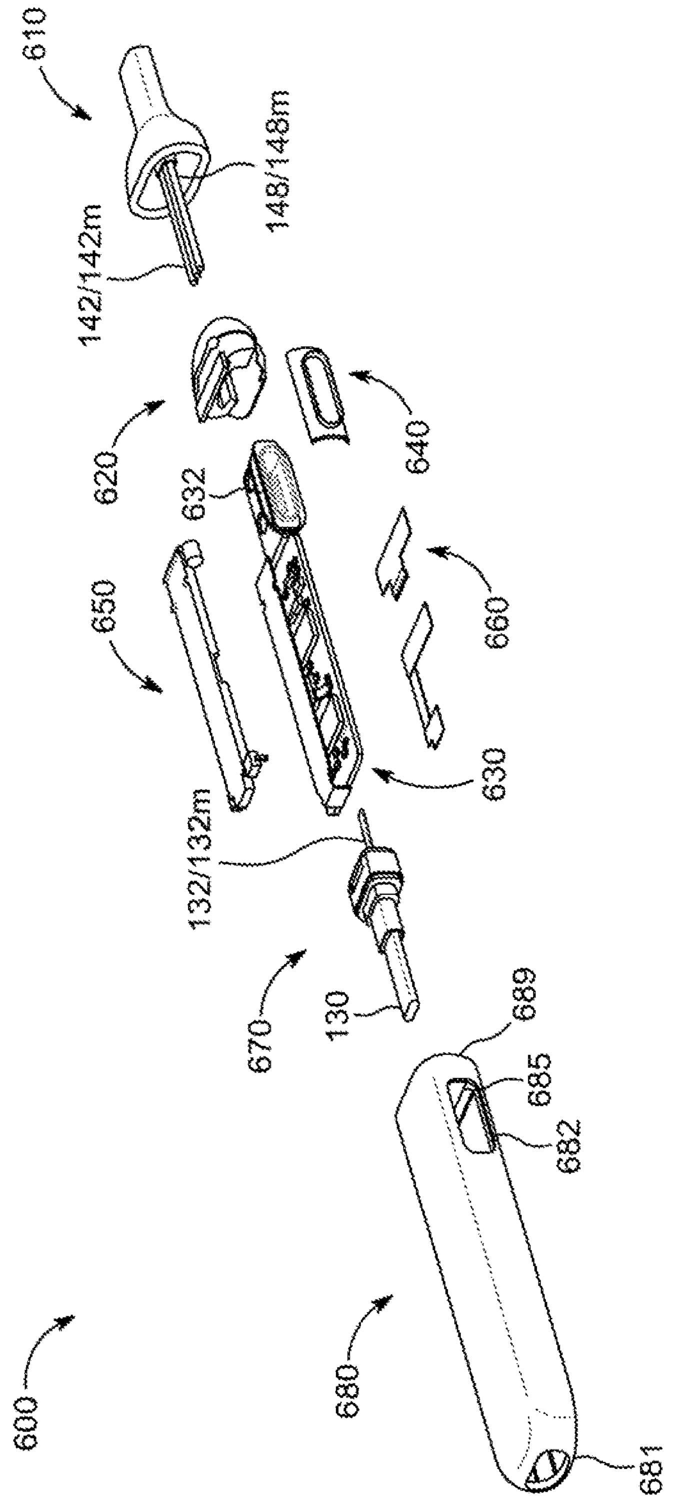
FIG. 8 is an exploded perspective view a logic subassembly of the earphone assembly of FIGS. 1-1F.

As shown in FIG. 8, logic subassembly 600 may include logic neckband housing portion 610, a logic neckband joint 620, a main logic board ("MLB") 630, a trim ring 640, an antenna carrier 650, an interconnect flex 660, a logic housing strain relief portion 670, and a main logic housing 680. Antenna carrier 650 may be coupled to any suitable components on MLB 630 and operative to communicate any suitable wireless signals with one or more remote entities (e.g., a media player, radio station communication device, etc.). Interconnect flex 660 may be operative to electrically couple any two or more elements within logic subassembly 600 (e.g., via MLB 630 or directly). Trim ring 640 may align with an opening 682 along a side surface of main logic housing 680 for protecting access to a connector 632 of MLB 630, where connector 632 may be operative to be electrically coupled with any suitable corresponding connector of a remote entity, such as a charging cable connector or a data carrying cable connector of a media device and/or the like. Logic housing strain relief portion 670 may provide strain relief to conductors 132 of cable subassembly 130, where conductor ends **132*m* of conductors 132 may be electrically coupled to a respective contact of MLB 630 or flex 660 or may be electrically coupled to or integral with a conductor 142 of cable subassembly 140. An inner portion of logic housing strain relief portion 670 may be positioned within an internal space 685 of main logic housing 680 and an outer portion of logic housing strain relief portion 670 may extend out from main logic housing 680 through a combox end opening 681 at an end of main logic housing 680 such that cable subassembly 130 may extend on to input subassembly 700. A neckband end opening 689 at an opposite end of main logic housing 680 may be coupled to logic neckband housing portion 610 to form the complete enclosure of logic subassembly 600, while logic neckband joint 620, MLB 630, antenna carrier 650, and interconnect flex 660 may be held at least partially within internal space 685 of main logic housing 680. Conductors 142 of cable subassembly 140 may extend through logic neckband housing portion 610 and logic neckband joint 620, while conductor ends 142*m* of conductors 142 may be electrically coupled to a respective contact of MLB 630 or flex 660 or may be electrically coupled to or integral with a conductor 132 of cable subassembly 130. Logic neckband joint 620 may be positioned to abut an end of cable subassembly 140 proximate conductor ends 142*m* for providing support to that cable subassembly end and/or to provide support and/or coupling locations for various other components of logic subassembly 600. Logic neckband housing portion 610 may be provided by any suitable material(s) using any suitable procedure(s), such as a rubber overmold with an inner cable extrusion component of any suitable thermoplastic elastomers ("TPE"). Logic neckband joint 620 may be provided by any suitable material(s) using any suitable procedure(s), such as plastic. MLB 630 may be provided by any suitable material(s) using any suitable procedure(s), such as a rigid flex antenna. Trim ring 640 may be provided by any suitable material(s) using any suitable procedure(s), such as metal. Antenna carrier 650 may be provided by any suitable material(s) using any suitable procedure(s), such as plastic. Interconnect flex 660 may be provided by any suitable material(s) using any suitable procedure(s), such as two or more layers of any suitable flexible interconnect material. Logic housing strain relief portion 670 may be provided by any suitable material(s) using any suitable procedure(s), such as polypropylene ("PP") and/or TPE. Main logic housing 680** may be provided by any suitable material(s) using any suitable procedure(s), such as plastic.

Figure 9:
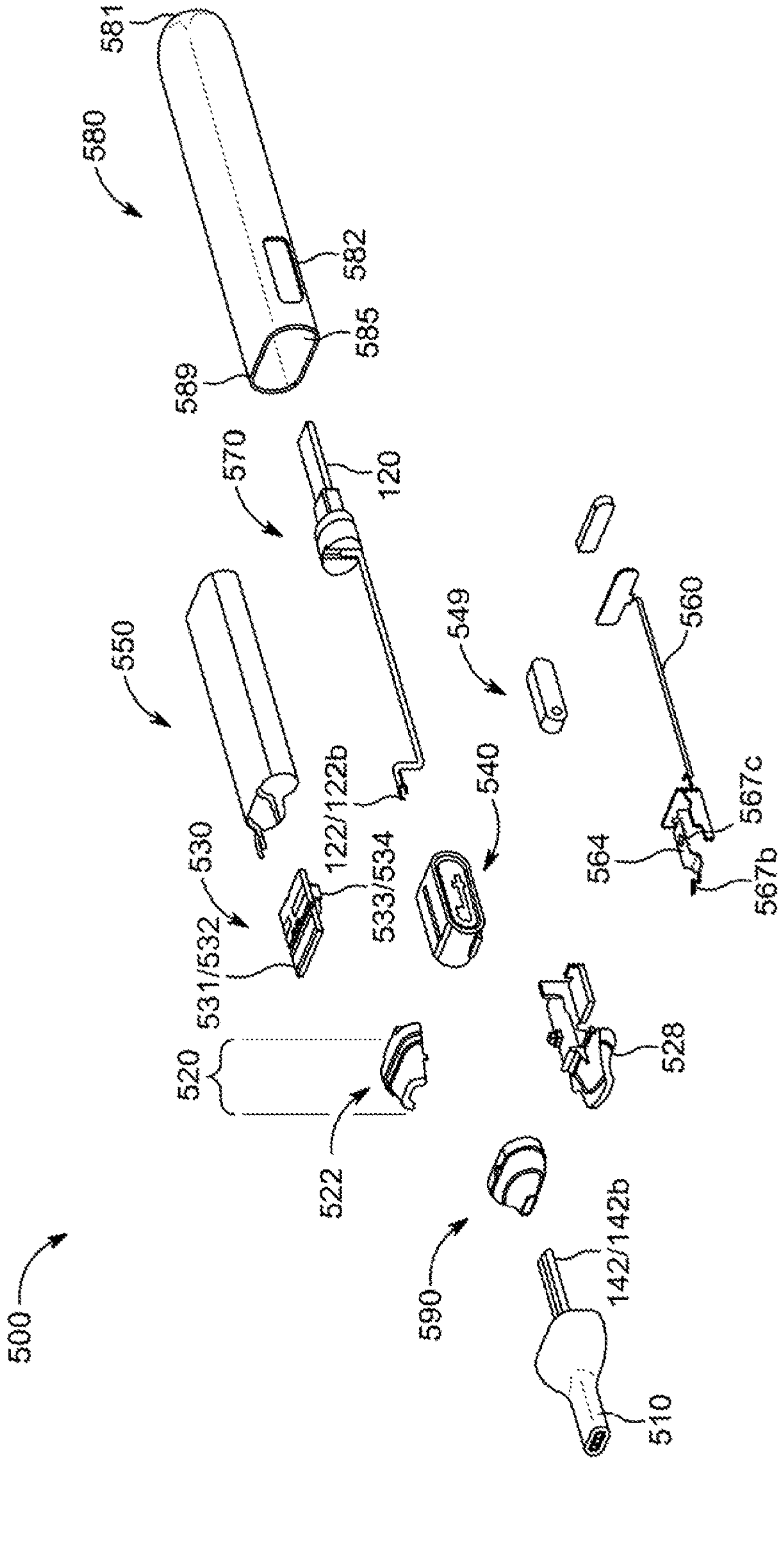
FIG. 9 is an exploded perspective view a power supply subassembly of the earphone assembly of FIGS. 1-1F.

As shown in FIG. 9, power supply subassembly 500 may include power neckband housing portion 510, a power neckband joint 520, a printed circuit board ("PCB") 530, a button carrier 540, a button 549, a battery 550, a battery bracket 560, a power housing strain relief portion 570, a main power housing 580, and a power neckband innermold portion 590. Battery 550 may be coupled to any suitable components on PCB 530 and operative to communicate any suitable power with one or more other components of assembly 100. Battery bracket 560 may be operative to help support battery 550 and/or couple battery 550 to PCB 530 and/or power neckband joint 520 and/or main power housing 580. Button carrier 540 may be electrically coupled to PCB 530 and/or any other suitable electrical contacts and may be operative to align with button 549 and an opening 582 along a side surface of main power housing 580 for protecting access to button 549 that may be actuated by a user to affect a function of assembly 100 (e.g., to power on or off assembly 100 using logic of PCB 530 and battery 550). Power housing strain relief portion 570 may provide strain relief to conductors 122 of cable subassembly 120, where conductor ends 122*b* of conductors 122 may be electrically coupled to a respective contact of PCB 530 or button carrier 540 or may be electrically coupled to or integral with a conductor 142 of cable subassembly 140. An inner portion of power housing strain relief portion 570 may be positioned within an internal space 585 of main power housing 580 and an outer portion of power housing strain relief portion 570 may extend out from main power housing 580 through an earbud end opening 581 at an end of main power housing 580 such that cable subassembly 120 may extend on to earbud subassembly 300. A neckband end opening 589 at an opposite end of main power housing 580 may be coupled to power neckband housing portion 510 to form the complete enclosure of power supply subassembly 500, while power neckband joint 520, PCB 530, button carrier 540, battery 550, and battery bracket 560 may be held at least partially within internal space 585 of main power housing 580 (see, e.g., FIGS. 13A-13D'). Conductors 142 of cable subassembly 140 may extend through power neckband housing portion 510 and power neckband joint 520, while conductor ends 142*b* of conductors 142 may be electrically coupled to a respective contact of PCB 530 or button carrier 540 or may be electrically coupled to or integral with a conductor 122 of cable subassembly 120. Power neckband joint 520 may be positioned to abut an end of cable subassembly 140 proximate conductor ends 142*b* for providing support to that cable subassembly end and/or to provide support and/or coupling locations for various other components of power supply subassembly 500. In some embodiments, power neckband joint 520 may include a top power neckband joint component 522 and a bottom power neckband joint component 528 that may be positioned on opposite sides of the end of cable subassembly 140 and then coupled together about cable subassembly 140. Power neckband innermold portion 590 may be operative to seal about top power neckband joint component 522 and bottom power neckband joint component 528 (e.g., to prevent mold material of power neckband housing portion 510 from flowing into the space defined by power neckband joint components 522 and 528 within which sensitive portions of conductors 142 may exist). Power neckband housing portion 510 may be provided by any suitable material(s) using any suitable procedure(s), such as a rubber overmold with an inner cable extrusion component of any suitable TPE(s). Power neckband joint 520 may be provided by any suitable material(s) using any suitable procedure(s), such as plastic. PCB 530 may be provided by any suitable material(s) or components using any suitable procedure(s), such as a switch, a light emitting diode ("LED"), interconnects, and/or the like. Button carrier 540 may be provided by any suitable material(s) using any suitable procedure(s), such as plastic and/or any suitable TPE(s). Button 549 may be provided by any suitable material(s) using any suitable procedure(s), such as plastic. Battery 550 may be provided by any suitable material(s) using any suitable procedure(s), such as two cylindrical power supply cells (e.g., 50 mAh). Battery bracket 560 may be provided by any suitable material(s) using any suitable procedure(s), such as sheet metal. Power housing strain relief portion 570 may be provided by any suitable material (s) using any suitable procedure(s), such PP and/or TPE. Main power housing 580 may be provided by any suitable material(s) using any suitable procedure(s), such as plastic. Power neckband innermold portion 590 may be provided by any suitable material(s) using any suitable procedure(s), such as any suitable TPE(s).

Neckband subassembly 140 may be provided by any suitable material(s) using any suitable procedure(s) and coupled to power supply subassembly 500 and logic subassembly 600 using any suitable techniques. For example, as shown in one or more of FIGS. 10A-12D, neckband subassembly 140 may include any suitable number of conductor bundles or conductors 142 (e.g., eight, or any other number greater than or less than eight), each of which may extend between a first conductor end 142*b* for coupling to power supply subassembly 500 and a second conductor end 142*m* for coupling to logic subassembly 600. Any suitable cover 148 may be provided about conductors 142, such as a TPE cover that may be extruded about conductors 142 and extending between a first cover end 148*b* proximate first conductor ends 142*b* and a second cover end 148*m* proximate second conductor ends 142*m*. Moreover, in some embodiments, as shown, neckband subassembly 140 may temporarily include a core component 144 that may be positioned between or otherwise alongside conductors 142 within cover 148 and may extend between a first core end 144*b* proximate first conductor ends 142*b* and a second core end 144*m* proximate second conductor ends 142*m*. Core component 144 may be made of any suitable material, such as steel, and may be any suitable shape, such as straight and at least slightly longer than length NBL of final neckband subassembly 140.

Figure 10A:
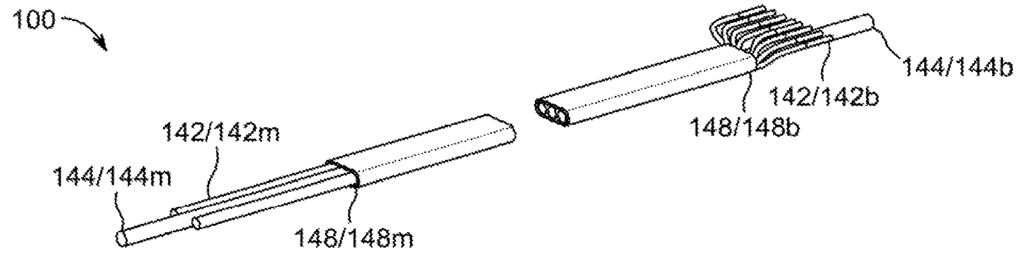
FIGS. 10A-10F are perspective views of the neckband subassembly of FIG. 7 at various stages of assembly.
Figure 10B:
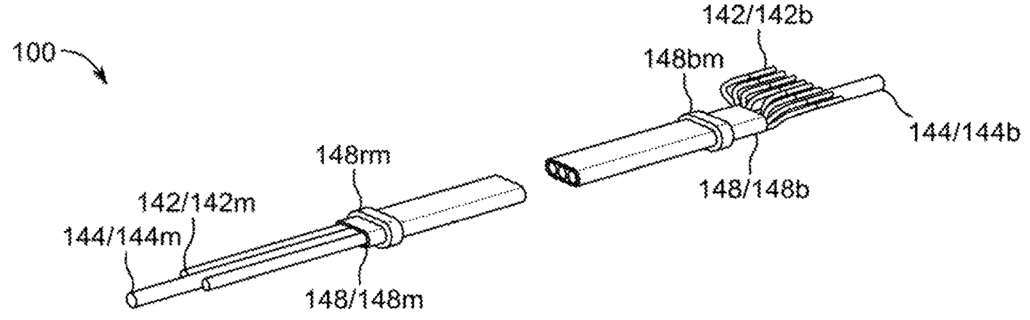

After neckband subassembly 140 has been initially created to include core component 144, as shown in FIG. 10A, a respective locating ring may be provided about a portion of cover 148 proximate to each cover end, where each locating ring may be made of plastic or any other suitable material and may be crimped or otherwise fixed to cover 148 to maintain its position along the length of cover 148 for facilitating future assembly operations of neckband subassembly 140. For example, as shown in FIG. 10B, a first locating ring 148*rb* may be disposed about cover 148 just offset from first cover end 148_b_, while a second locating ring 148_rm_ may be disposed about cover 148 just offset from second cover end 148_m_.

Figure 10C:
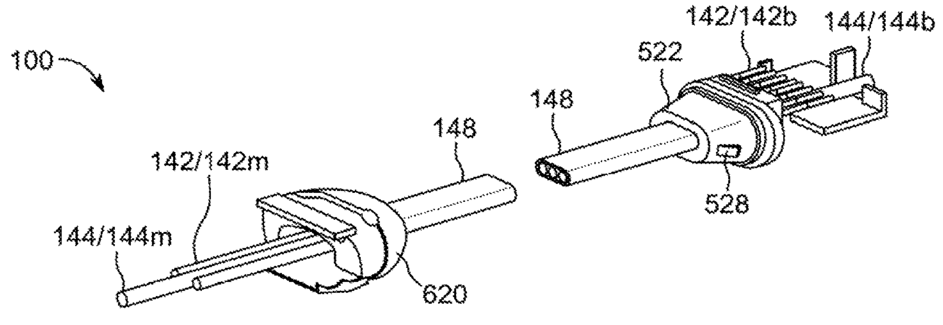
Figure 11A:
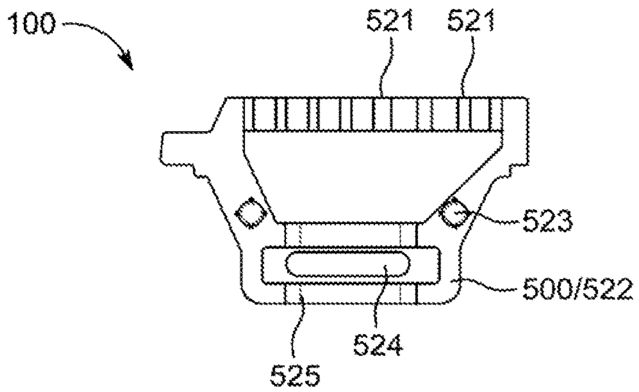
FIGS. 11A-11E are perspective views of a portion of the neckband subassembly of FIGS. 7 and 10A-10F at various stages of assembly.
Figure 11B:
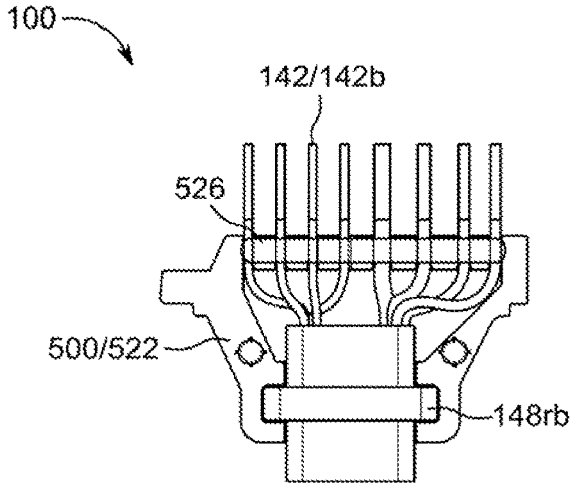
Figure 11C:
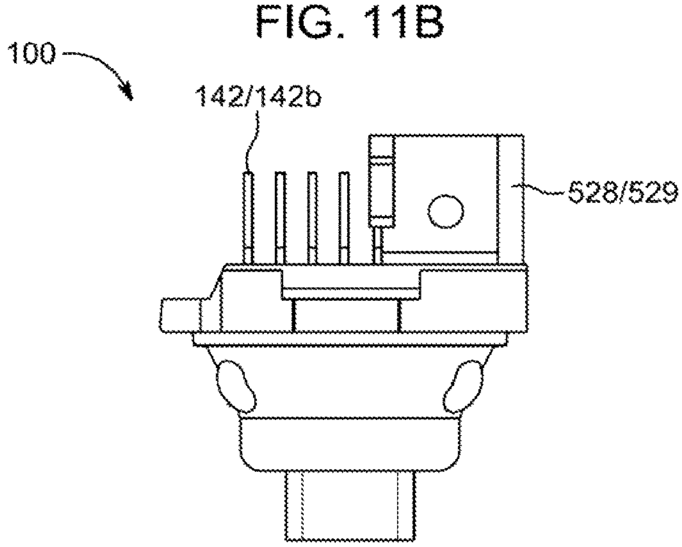

As shown in FIGS. 10C and 11A-11C, power neckband joint 520 may be positioned about a first portion of cover 148 that may include first locating ring 148_rb_ and/or first cover end 148_b_. For example, as shown in FIGS. 11A and 11B, top power neckband joint component 522 may include at least one conductor groove 521 that may be operative to receive and define a path for a portion of a respective conductor 142 of neckband subassembly 140 that may not be covered by cover 148 proximate that conductor's first conductor end 142_b_ (e.g., eight distinct conductor grooves 521 may be provided, each of which may receive a respective one of eight conductors 142), and then a glue or any other suitable adhesive component 526 may be applied to each conductor 142 and conductor groove 521 to fix each conductor 142 along a particular groove 521 (e.g., adhesive component 526 may be any suitable ultraviolet ("UV") curing glue). As also shown, top power neckband joint component 522 may include a ring groove 524 that may be operative to receive and hold first locating ring 148_bm_ of neckband subassembly 140 and/or a cover groove 525 that may be operative to receive and hold one or more portions of cover 148 proximate first cover end 148_b_ (e.g., the portions of cover 148 about first locating ring 148_bm_), such that neckband subassembly 140 may be held at a particular position with respect to top power neckband joint component 522 that may facilitate the proper positioning of each conductor 142 in a respective conductor groove 521 (e.g., an adhesive (e.g., a high viscosity, ethyl-based instant adhesive) may be applied to the surface of top power neckband joint component 522 providing grooves 521, groove 524, and groove 525 for holding conductors 142, ring 148_bm_, and cover 148, respectively). As also shown, top power neckband joint component 522 may include one or more bottom power neckband joint mating features 523 that may be used to align and mate with one or more respective features on bottom power neckband joint component 528 for coupling the two components together (e.g., as shown in FIGS. 10C and 11C). Moreover, as shown in FIG. 10C, logic neckband joint 620 may be positioned about a second portion of cover 148 that may include second locating ring 148_rm_ and/or second cover end 148_m_ (e.g., second conductor end 142_m_ of each conductor 142 and core end 144_m_ of neckband subassembly 140 may be passed through logic neckband joint 620 such that second locating ring 148_rm_ and/or second cover end 148_m_ may be positioned within an interior space defined by logic neckband joint 620). While logic neckband joint 620 may be shown as a single unitary component, power neckband joint 520 may be provided as top power neckband joint component 522 and bottom power neckband joint component 528 such that unfettered access may be provided to each conductor groove 521 for enabling specific positioning of each conductor 142 proximate its conductor end 142_b_ at power neckband joint 520 (e.g., due to a limited length (e.g., 3 millimeters) of each conductor 142 between its conductor end 142_b_ and its conductor portion retained by its respective conductor groove 521 (e.g., a distance between power neckband joint 520 and PCB 530 to which each conductor end 142_b_ may be electrically coupled (e.g., via hot bar soldering) may be much shorter than the distance between logic neckband joint 620 and MLB 630 at which each conductor end 142_m_ may be electrically coupled, such that specific positioning of each conductor end 142_b_ with respect to power neckband joint 520 ought to be accomplished within power neckband joint 520)).

Figure 10D:
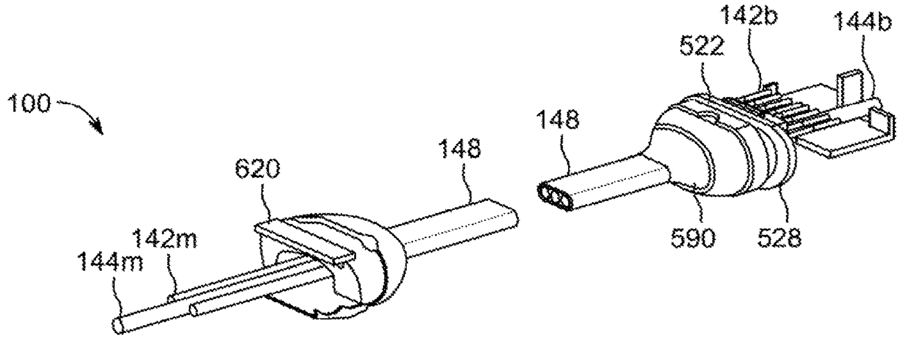
Figure 10E:
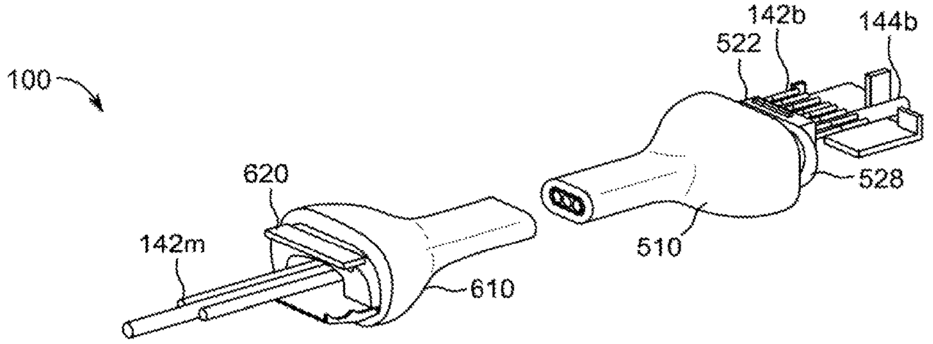
Figure 10F:
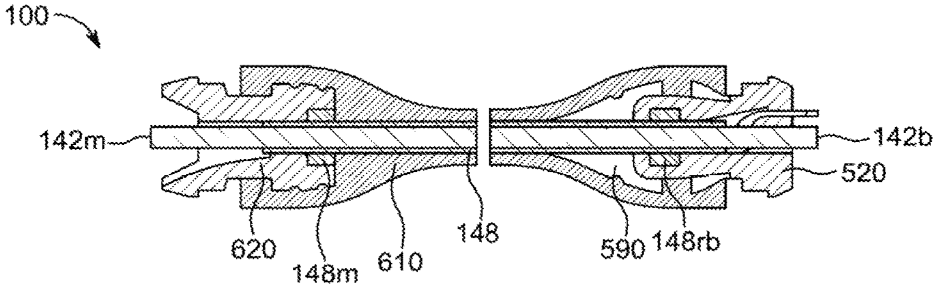
Figure 11D:
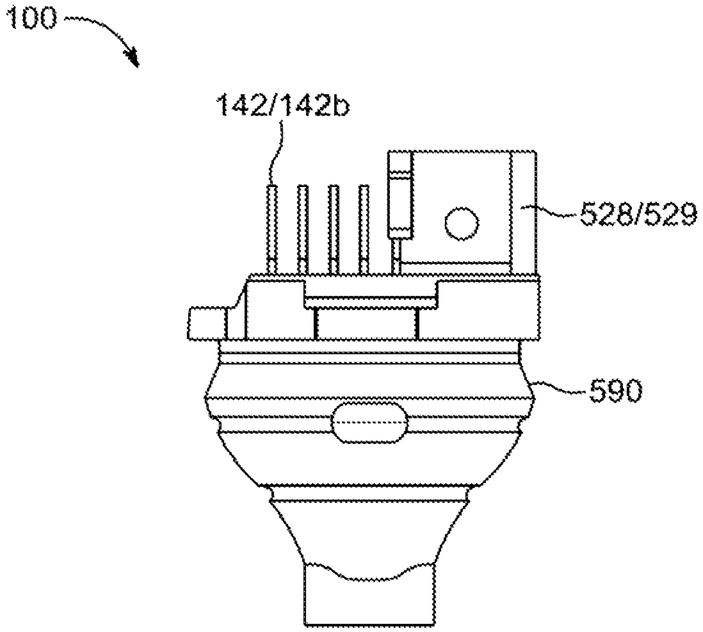
Figure 11E:
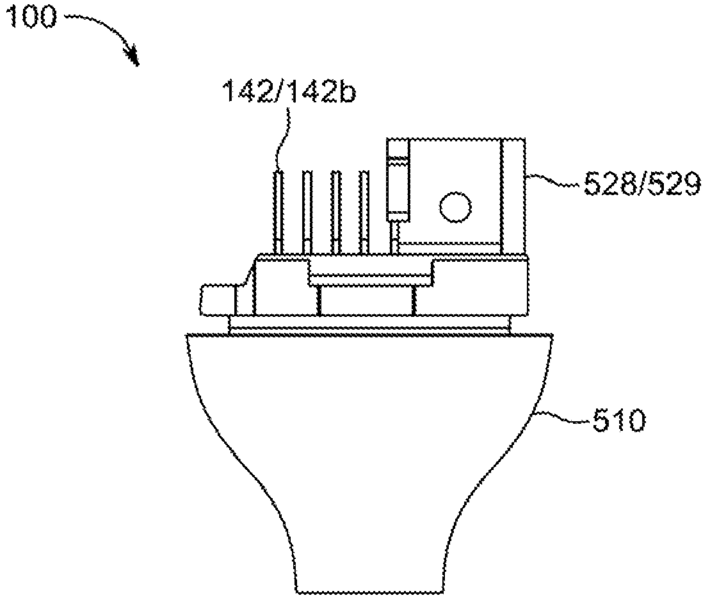

Next, as shown in FIGS. 10D and 11D, power neckband innermold portion 590 may be positioned about a portion of top power neckband joint component 522 and about a portion of bottom power neckband joint component 528 of power neckband joint 520. For example, power neckband innermold portion 590 may be molded (e.g., using any suitable TPE(s)) about power neckband joint 520 to cover any seam formed between top power neckband joint component 522 and bottom power neckband joint component 528, such that power neckband innermold portion 590 may be operative to seal about top power neckband joint component 522 and bottom power neckband joint component 528 (e.g., to prevent mold material of power neckband housing portion 510 from flowing into the space defined by power neckband joint components 522 and 528 within which sensitive portions of conductors 142 may exist or through which sensitive portions of conductors 142 may be accessed). Then, as shown in FIGS. 10E, 10F, and 11E, power neckband housing portion 510 may be positioned about a portion of power neckband joint 520 and/or about a portion of power neckband innermold portion 590 and/or about a portion of neckband subassembly 140 to provide a cosmetic and/or protective shell about portions of the coupling joint between neckband subassembly 140 and power supply subassembly 500 (e.g., any suitable overmolding process using any suitable materials (e.g., silicone) may be used to provide power neckband housing portion 510). Similarly, as also shown, logic neckband housing portion 610 may be positioned about a portion of logic neckband joint 620 and/or about a portion of neckband subassembly 140 to provide a cosmetic and/or protective shell about portions of the coupling joint between neckband subassembly 140 and logic subassembly 600 (e.g., any suitable overmolding process using any suitable materials (e.g., silicone) may be used to provide logic neckband housing portion 610). It is to be noted that certain portions of bottom power neckband joint component 528 and core component 144 are not shown in FIGS. 11C-11E.

Figure 12A:
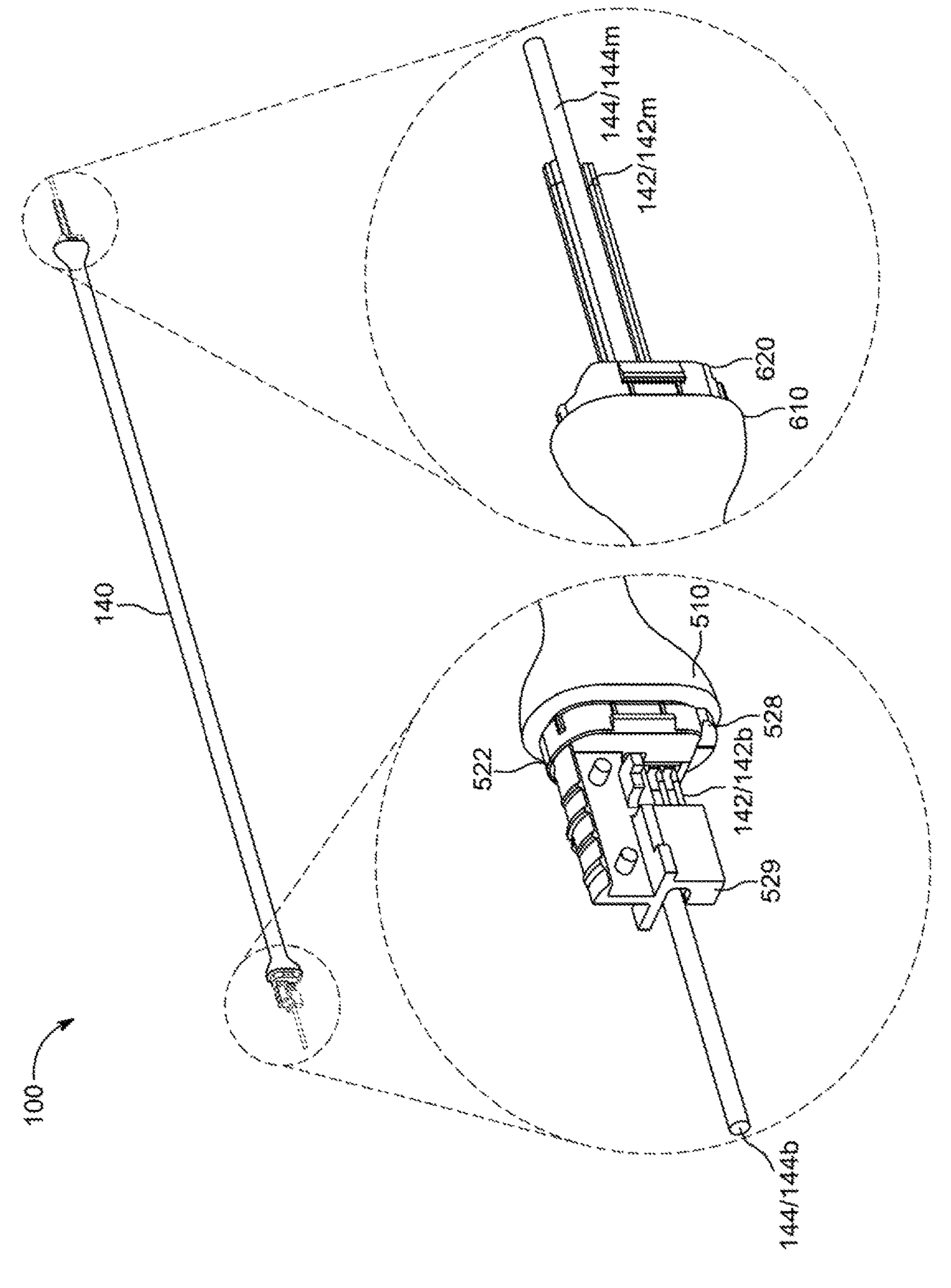
FIGS. 12A-12D are perspective views of a portion of the neckband subassembly of FIGS. 7 and 10A-11E at various stages of assembly.
Figure 12B:
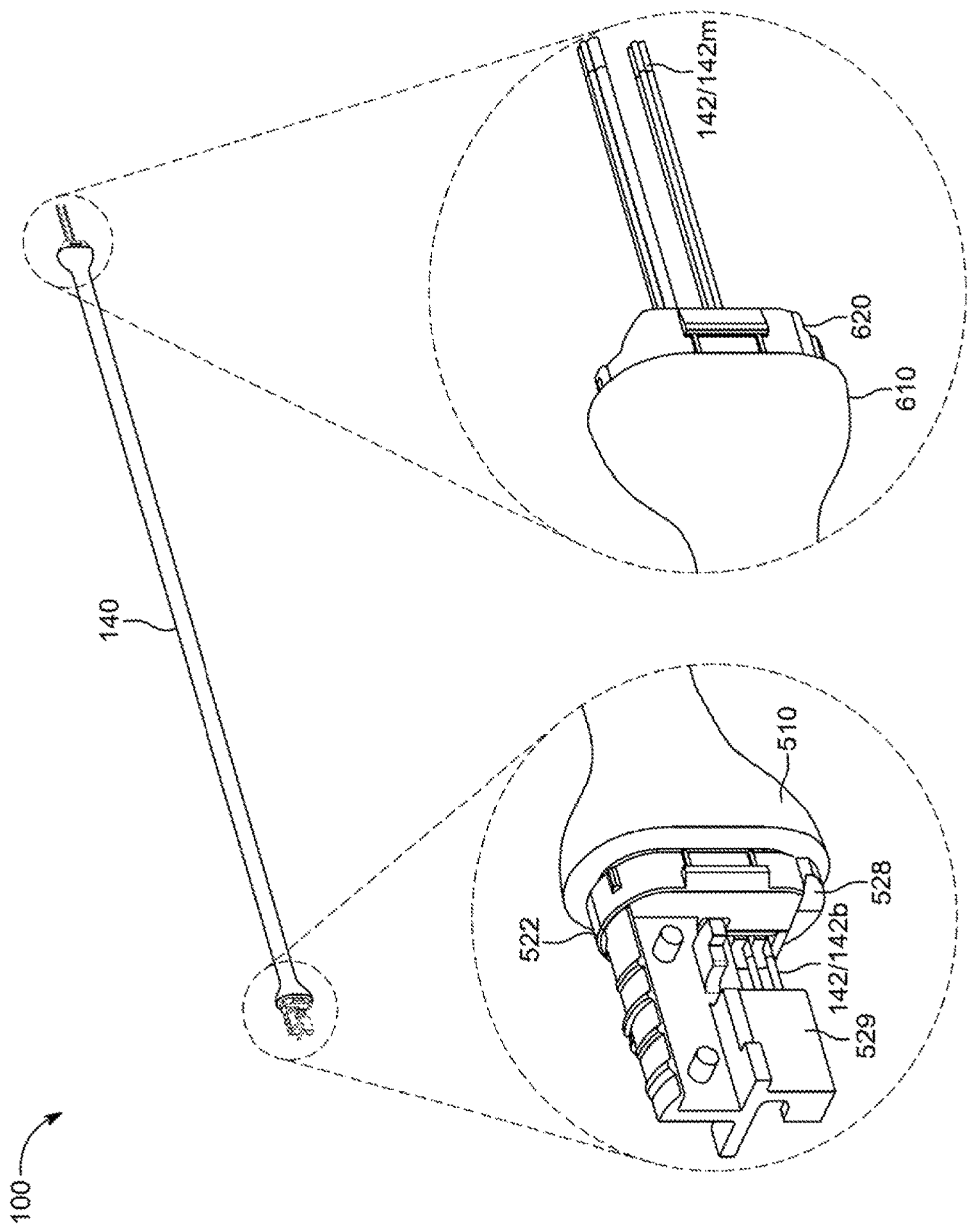

As shown in FIG. 12A, core component 144 may extend between ends 144_b_ and 144_m_ through the entirety of neckband subassembly 140 as well as through power neckband housing portion 510 and power neckband joint 520 and power neckband innermold portion 590 of power supply subassembly 500 as well as through logic neckband housing portion 610 and logic neckband joint 620 of logic subassembly 600, where a rigid linear length of core component 144 may maintain neckband subassembly 140 in a linear shape. As shown, core component 144 proximate core end 144_b_ may be supported by or at least extend along a top surface of an extension arm 529 of bottom power neckband joint component 528. Next, as shown in FIG. 12B, core component 144 may be removed from earphone assembly 100 (e.g., from neckband subassembly 140 and power supply subassembly 500 and logic subassembly 600, in any suitable direction (e.g., by pulling core end 144_m_ away from logic subassembly 600 such that core end 144_b_ may eventually exit logic neckband joint 620 of logic subassembly 600, or by pulling core end 144_b_ away from power supply subassembly 500 such that core end 144_m_ may eventually exit power neckband joint 520 of power supply subassembly 500)). Once core component 144 has been removed from neckband subassembly 140, neckband subassembly 140 may later include a memory component 146 that may be positioned between or otherwise alongside conductors 142 within cover 148, such as in replacement of core component 144, and may extend between a first memory end 146_b_ proximate first conductor ends 142_b_ and a second memory end 146_m_ proximate second conductor ends 142_m_. Memory component 146 may be made of any suitable material, such as one or two or more nitinol steel wires, and may be any suitable shape, such as a curved shape to define the curved shape of final neckband subassembly 140. The defined shape of memory component 146 may be formed using any suitable process and/or materials such that the shape may be resilient, whereby memory component 146 may be operative to return to the shape absent any external forces (e.g., any external forces above a certain magnitude) being applied thereto (e.g., to enable memory component 146 to deform out of the curved shape when a user applies a strong force to memory component 146 but then to return to the curved shape when a strong force is removed, such that memory component 146 may be operative to hold neckband subassembly 140 in the curved shape of FIG. 1).

Figure 12C:
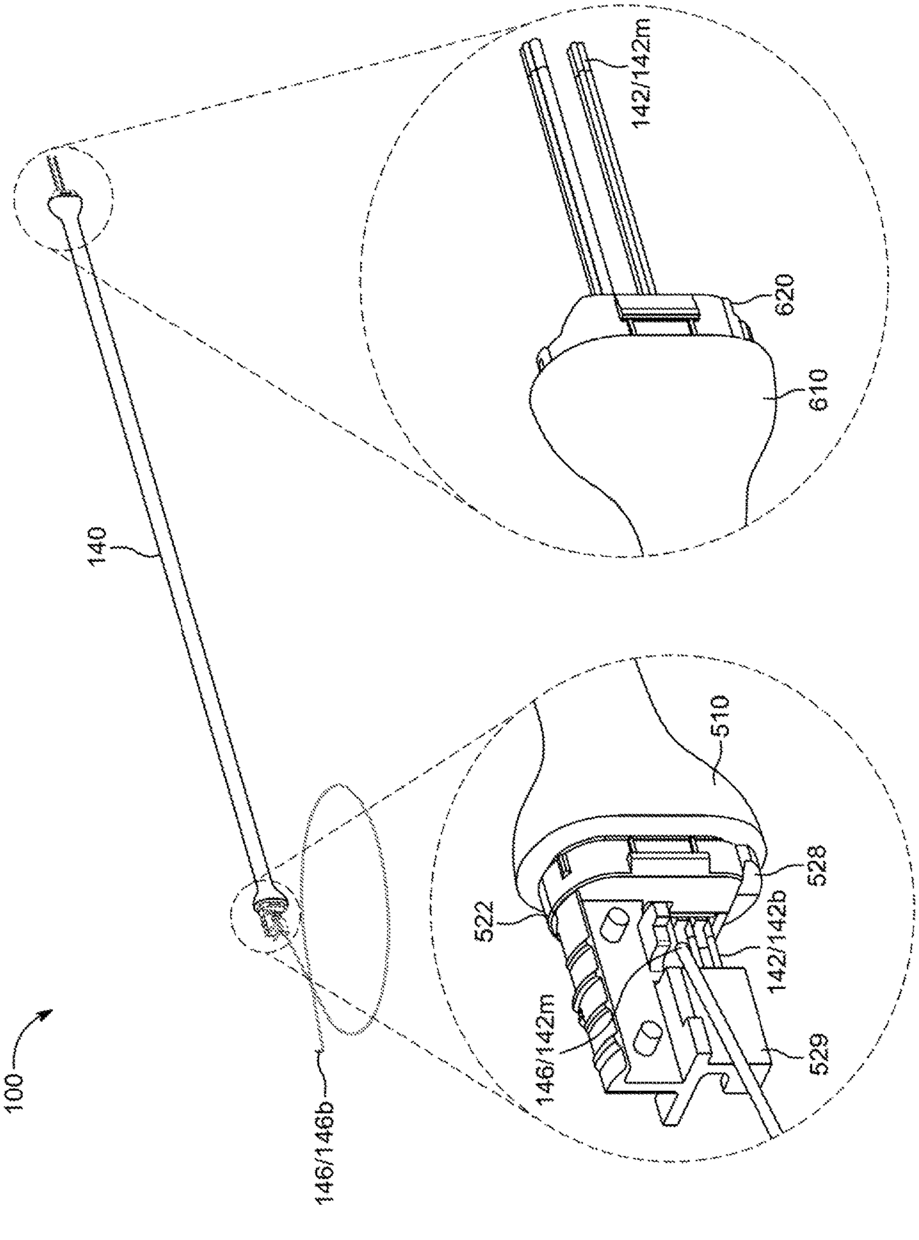

As shown in FIG. 12C, memory component 146 may be introduced into assembly 100 in at least a portion of a space previously occupied by core component 144 (e.g., the same space within neckband subassembly 140 and at least a portion of the same space within power supply subassembly 500 and/or at least a portion of the same space within logic subassembly 600). As shown, second end 146_m_ of memory component 146 may be inserted into power neckband joint 520 through an opening to the space previously occupied by core component 144. This opening may be accessed by second end 146_m_ of memory component 146 from a bottom surface of extension arm 529 of bottom power neckband joint component 528 (e.g., not from along the same top surface of extension arm 529 along which core component 144 extended (see, e.g., FIG. 12A)).

Figure 12D:
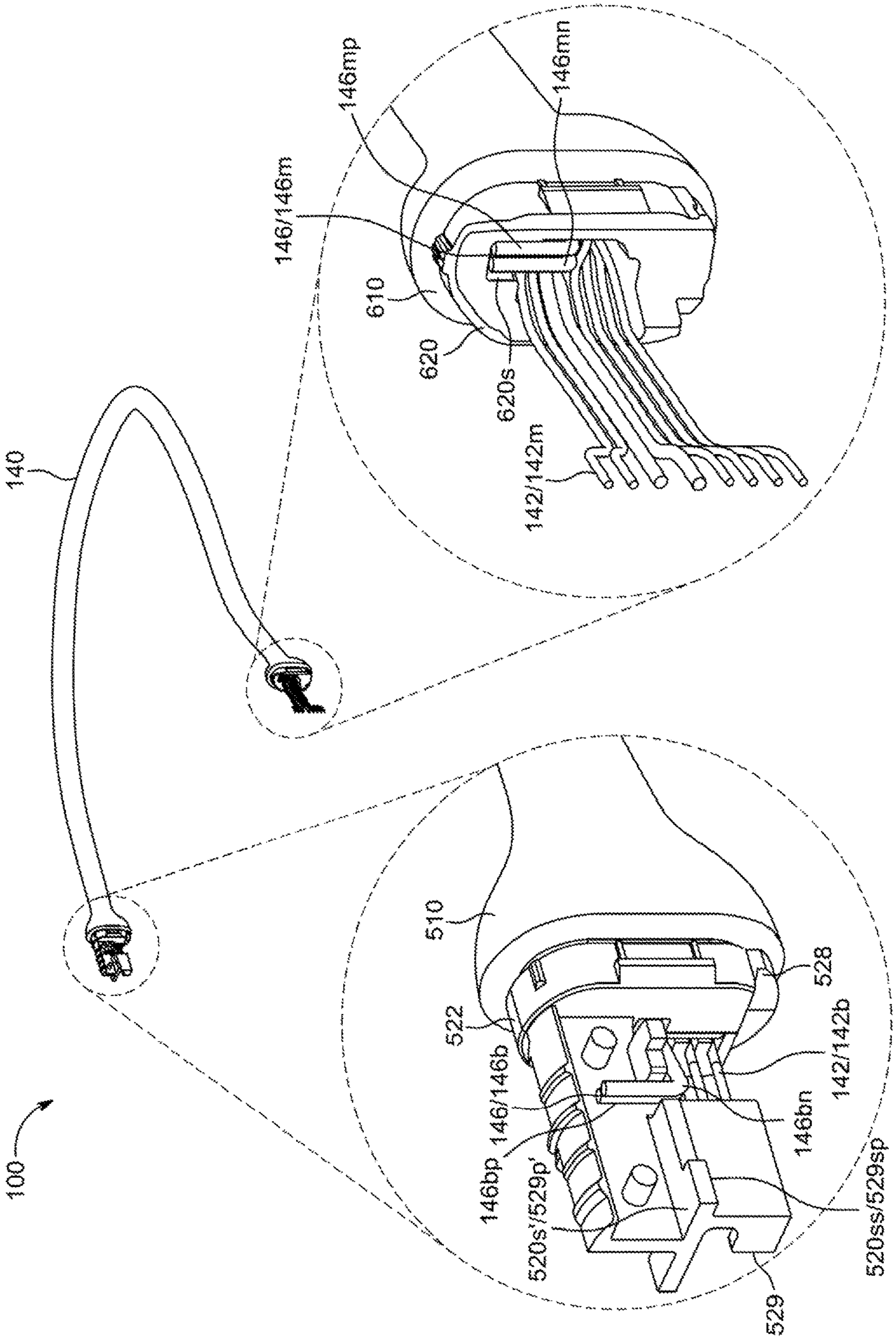

Once second end 146_m_ of memory component 146 has been moved through neckband subassembly 140 and out from logic neckband joint 620 of logic subassembly 600, first end 146_b_ of memory component 146 may be fixed to or otherwise held against at least a portion of power supply subassembly 500 while second end 146_m_ of memory component 146 may be fixed to or otherwise held against at least a portion of logic subassembly 600 (e.g., memory component 146 may be deformed out from its curved shape into any other suitable shape (e.g., a straight shape) in any suitable manner, such as by applying any suitable any external forces above a certain magnitude to memory component 146 (e.g., by applying a pulling force at opposite ends 146_b_ and 146_m_ of memory component 146), while memory component 146 may be introduced into assembly 100 in at least a portion of a space previously occupied by core component 144, where the deformed shape may be easier to introduce than the curved shape). For example, as shown in FIG. 12D, a portion of memory component 146 may be bent at any suitable angle (e.g., 90°) proximate to second end 146_m_ for defining a bend region 146_mn_ (e.g., along each of the two illustrated memory wires of memory component 146), such that at least a portion of a memory component section 146_mp_ extending between bend region 146_mn_ and second end 146_m_ may be operative to extend along and against a surface 620_s_ of logic neckband joint 620 that may face away from the direction in which memory component 146 travels through logic neckband joint 620 towards neckband subassembly 140. As shown, surface 620_s_ may also define or be adjacent another surface of logic neckband joint 620 defining an opening through which conductors 142 may extend out from logic neckband joint 620. A glue (e.g., any suitable UV curing glue) or any other suitable adhesive component (not shown) may be applied to at least a portion of memory component section 146_mp_ and/or to at least a portion of surface 620_s_ to help fix memory component 146 to logic neckband joint 620. Any other suitable portions of any suitable other components of logic subassembly 600 may then be coupled to logic neckband housing portion 610 and/or logic neckband joint 620 for completing the assembly of logic subassembly 600 (e.g., as described with respect to FIG. 8). In some embodiments, certain couplings between component features of logic subassembly 600 may also be operative to retain memory component 146 to logic neckband joint 620 or otherwise to logic subassembly 600.

Additionally, as also shown in FIG. 12D, a portion of memory component 146 may be bent at any suitable angle (e.g., 90°) proximate to first end 146_b_ for defining a bend region 146_bn_ (e.g., along each of the two illustrated memory wires of memory component 146), such that at least a portion of a memory component section 146_bp_ extending between bend region 146_bn_ and first end 146_b_ may be operative to extend along and against a surface 520_s_ of power neckband joint 520 that may face away from the direction in which memory component 146 travels through power neckband joint 520 towards neckband subassembly 140. As shown, surface 520_s_ may be defined by a protrusion 529_p_ that may be extending out away from a bottom surface of extension arm 529 of bottom power neckband joint component 528 and another portion of memory component section 146_bp_ may extend along and/or against a portion of that bottom surface of extension arm 529. Neither protrusion 529_p_ nor the bottom surface of extension arm 529 may define a surface of power neckband joint 520 defining an opening through which conductors 142 may extend out from power neckband joint 520. Instead, conductors 142 may extend along or adjacent to a portion of a top surface of extension arm 529 of power neckband joint 520. A glue (e.g., any suitable UV curing glue) or any other suitable adhesive component (not shown) may be applied to at least a portion of memory component section 146_bp_ and/or to at least a portion of surface 520_s_ to help fix memory component 146 to power neckband joint 520. As also shown, a second surface 520_s_' of a second protrusion 529_p_' that may be extending out away from the bottom surface of extension arm 529 of bottom power neckband joint component 528 may also be used to retain memory component section 146_bp_ or at least to prevent memory component section 146_bp_ from moving further away from neckband subassembly 140.

Figure 13A:
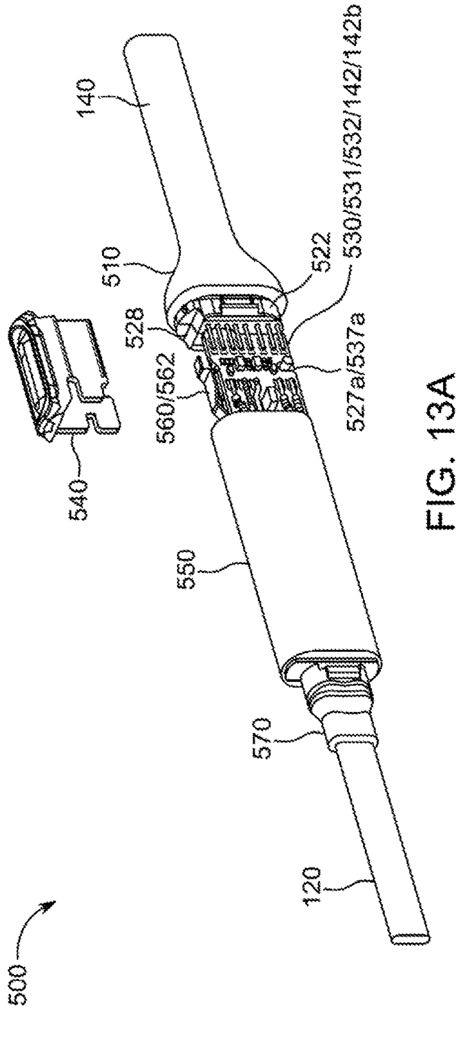
FIGS. 13A-13D' are perspective views of the power supply subassembly of FIG. 9 at various stages of assembly.
Figure 13A:
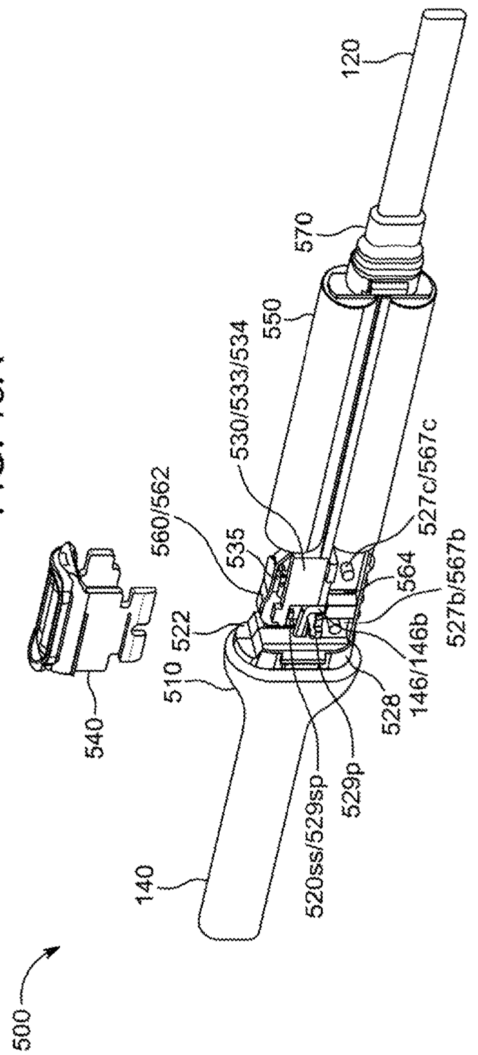

Any other suitable portions of any suitable other components of power supply subassembly 500 may then be coupled to power neckband housing portion 510 and/or power neckband joint 520 for completing the assembly of power supply subassembly 500 (e.g., as described with respect to FIG. 9). In some embodiments, certain couplings between component features of power supply subassembly 500 may also be operative to retain memory component 146 to power neckband joint 520 or otherwise to power supply subassembly 500. As shown in FIGS. 13A and 13A', prior to button carrier 540 being coupled to PCB 530, one, some, or each one of conductors 142 at or proximate to conductor end 142_b_ may be electrically coupled (e.g., using any suitable technique, such as hot bar soldering) to a respective contact 532 of PCB 530 (e.g., each contact 532 may be provided by a top surface 531 of PCB 530), while a first projection 527_a_ extending from a surface of power neckband joint 520 (e.g., from a top surface of top power neckband joint component 522) may extend through a slot 537_a_ in PCB 530 for properly aligning and/or holding PCB 530 in position with respect to power neckband joint 520. Moreover, as also shown in FIGS. 13A and 13A', prior to button carrier 540 being coupled to PCB 530, a switch component 534 (e.g., any suitable tactile switch component) may be provided on PCB 530, where switch component 534 may be coupled to a bottom surface 533 of PCB 530 and may include a switch element 535 extending upwards towards button carrier 540, where a lower surface of PCB 530 may be positioned to rest on and/or be fitted against and/or about a surface 520*ss* of a raised subprojection 529*sp* of projection 529*p*' of bottom power neckband joint component 528 of power neckband joint 520 and/or a leading surface of PCB 530 may be positioned to push against memory component section 146*bp* towards neckband subassembly 140 (see, e.g., FIGS. 12D, 13A', 14L, and 14M). Moreover, as also shown in FIGS. 13A and 13A', prior to button carrier 540 being coupled to PCB 530, one or more conductors or contacts of battery 550 may be electrically coupled (e.g., using any suitable technique, such as hot bar soldering) to a respective battery contact of PCB 530 (e.g., each battery contact may be provided by top surface 531 of PCB 530). Moreover, as also shown in FIGS. 13A and 13A', prior to button carrier 540 being coupled to PCB 530, battery bracket 560 and power housing strain relief portion 570 may be positioned about and/or against batter 550, where a bracket arm 562 of battery bracket 560 may include a free end extending away from battery 550 towards power neckband joint 520, such that bracket arm 562 may rest on or extend over a top of switch element 535 of switch component 534, and where a bracket arm 564 of battery bracket 560 may include a free end extending away from battery 550 towards power neckband joint 520, such that a slot 567*b* of bracket arm 564 may receive a second projection 527*b* extending from a surface of power neckband joint 520 (e.g., from a bottom surface of bottom power neckband joint component 528) and/or such that a hole 567*c* through bracket arm 564 may receive a third projection 527*c* extending from a surface of power neckband joint 520 (e.g., from a bottom surface of bottom power neckband joint component 528) for properly aligning and/or holding battery bracket 560 in position with respect to power neckband joint 520.

Figure 13B:
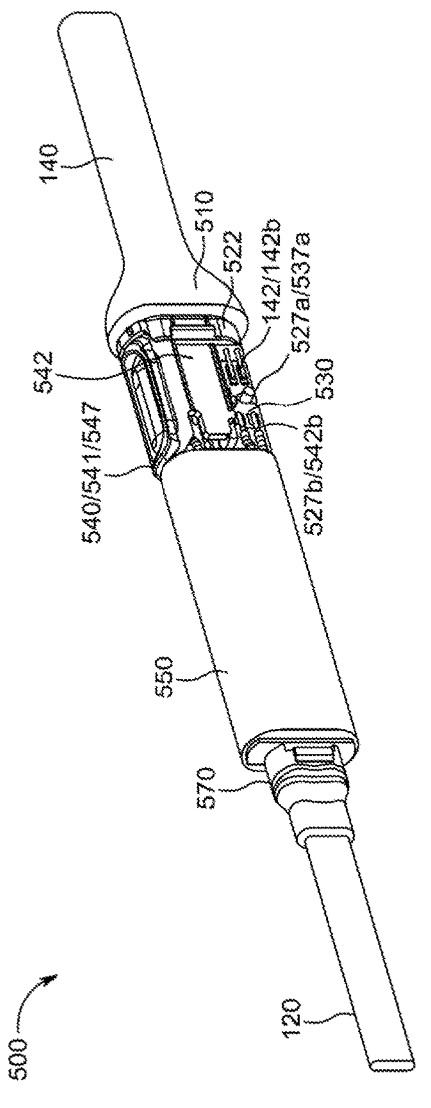
Figure 13B:
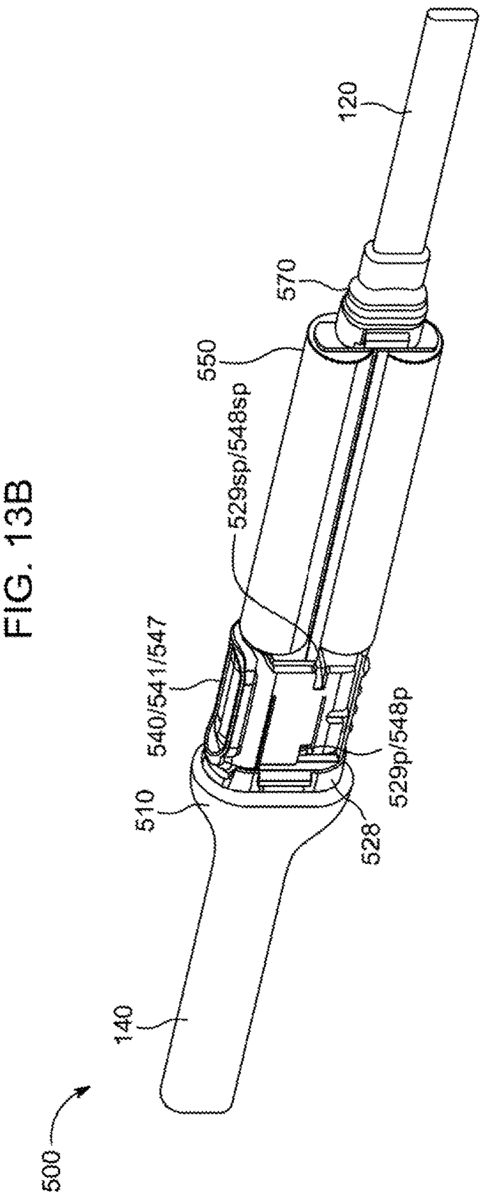
Figure 13C:
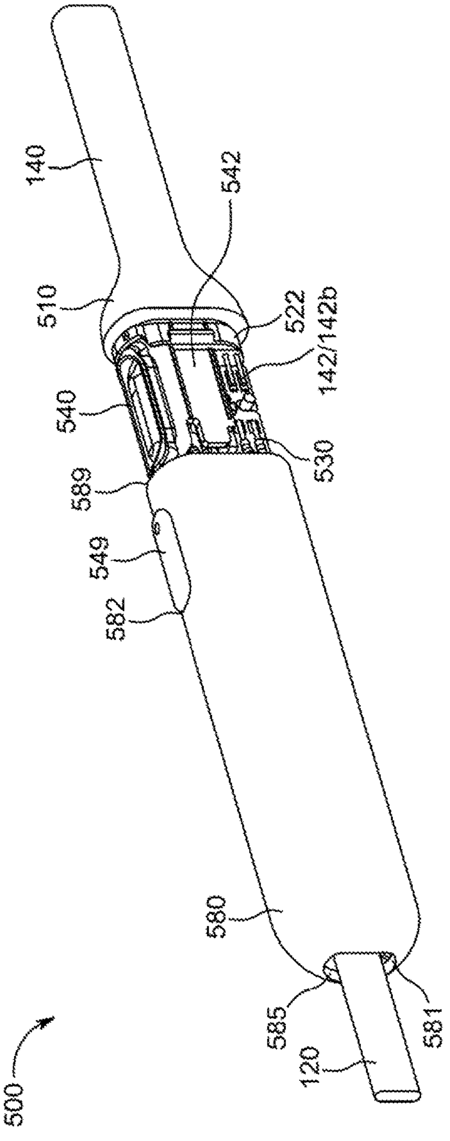
Figure 13C:
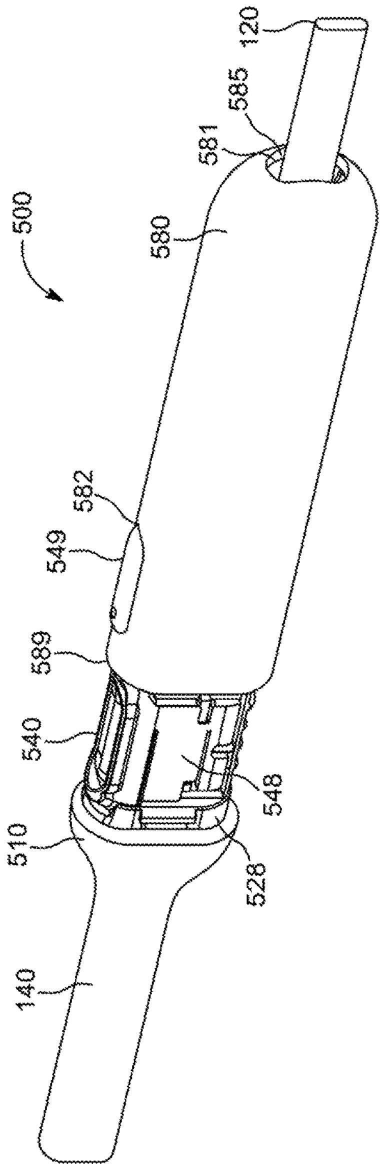
Figure 13D:
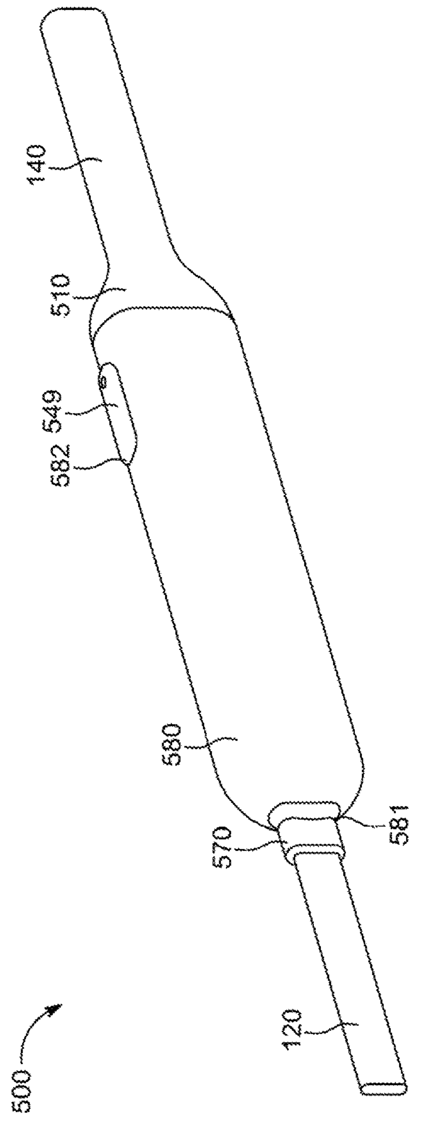
Figure 13D:
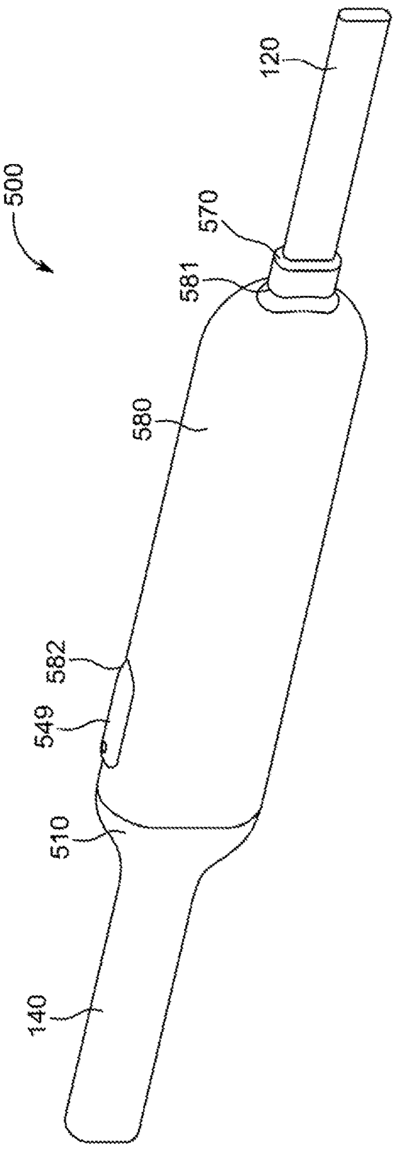
Figure 14A:
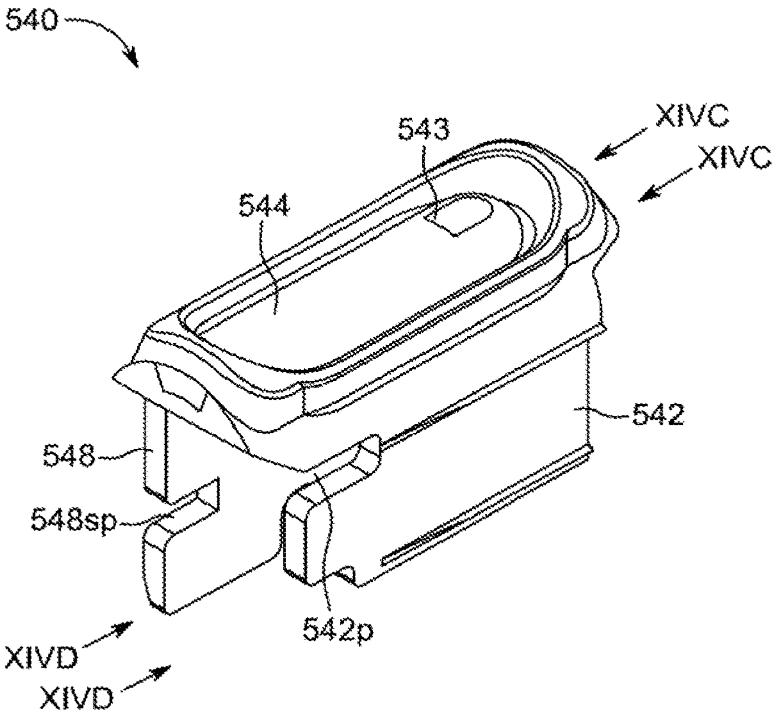
FIGS. 14A-14K are various views of a button carrier of the power supply subassembly of FIGS. 9 and 13A-13D'.
Figure 14B:
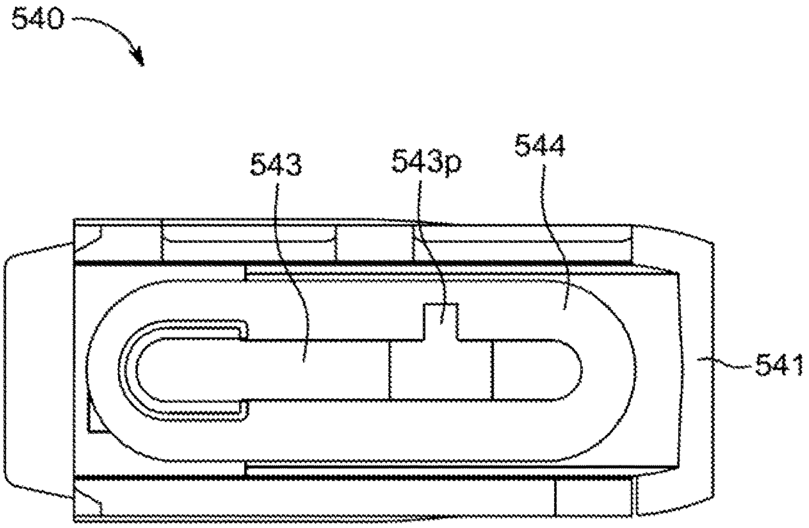
Figure 14C:
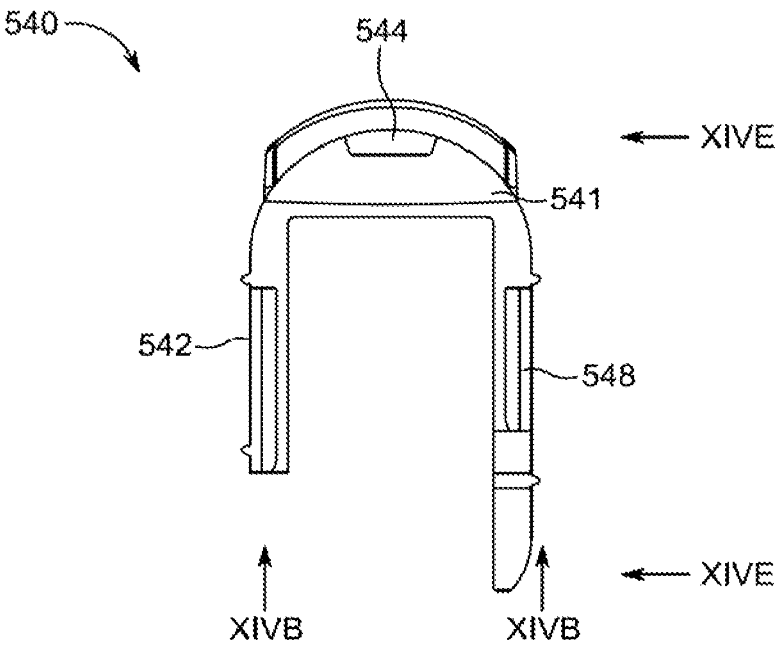
Figure 14D:
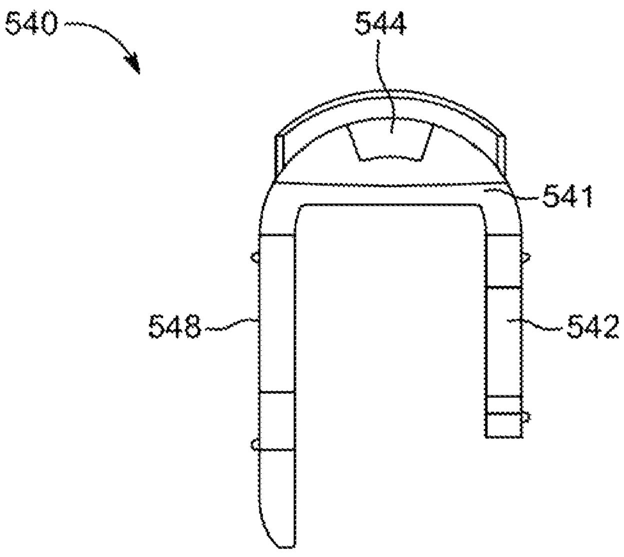
Figure 14E:
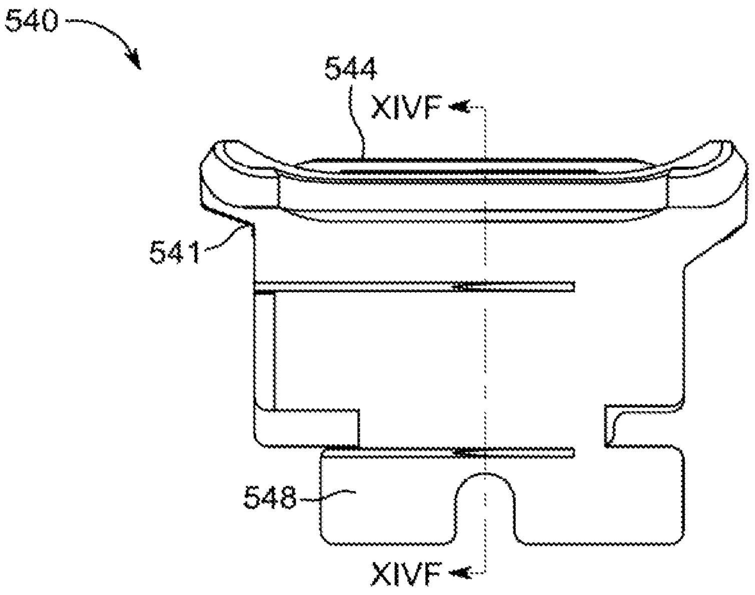
Figure 14F:
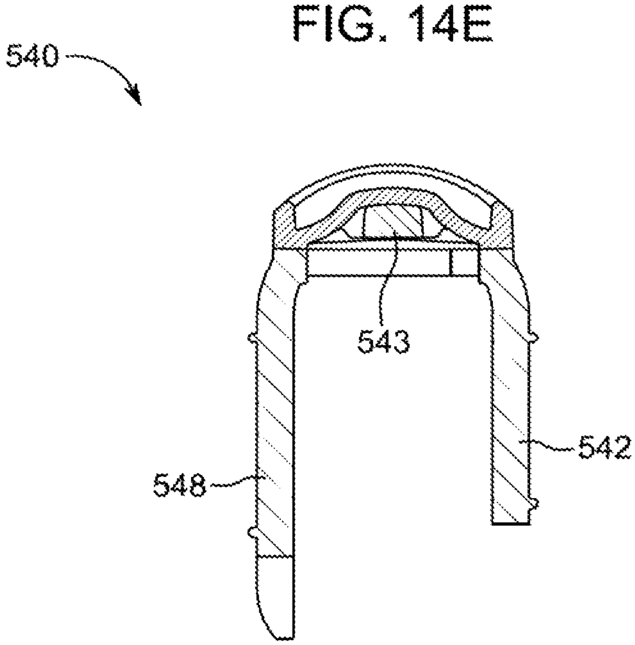
Figure 14G:
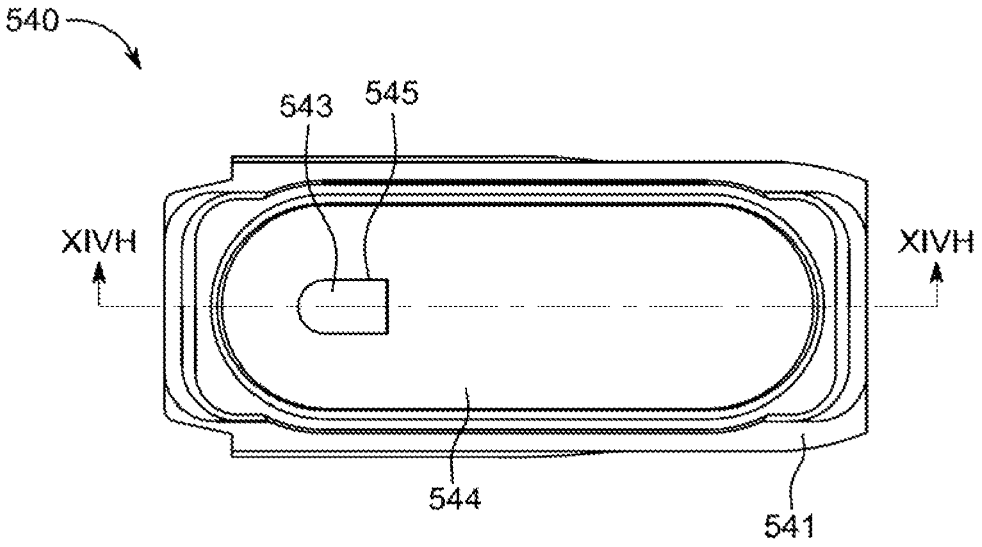
Figure 14H:
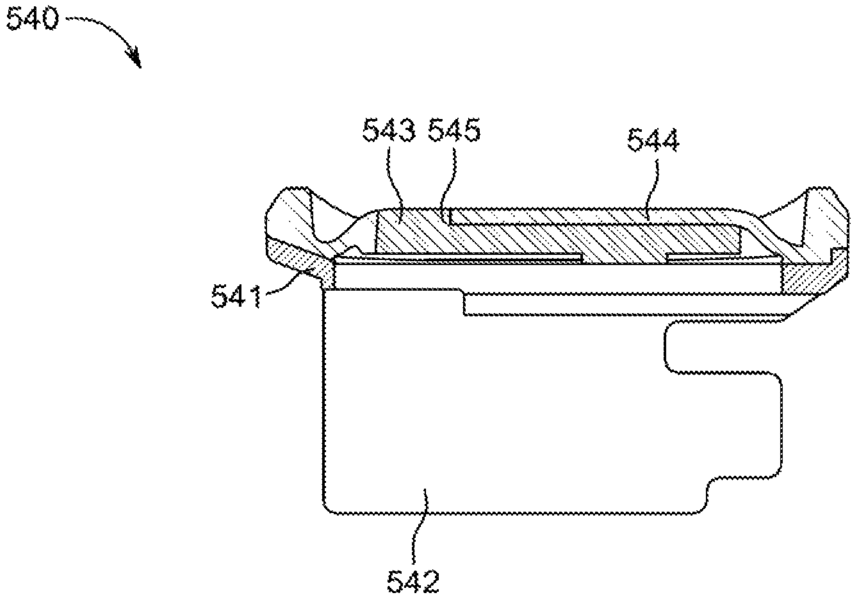
Figure 14I:
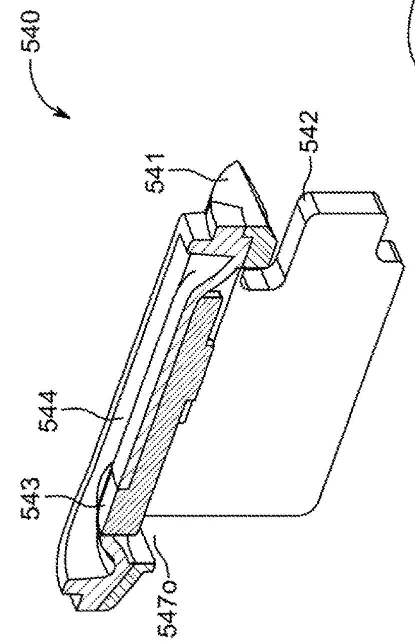
Figure 14K:
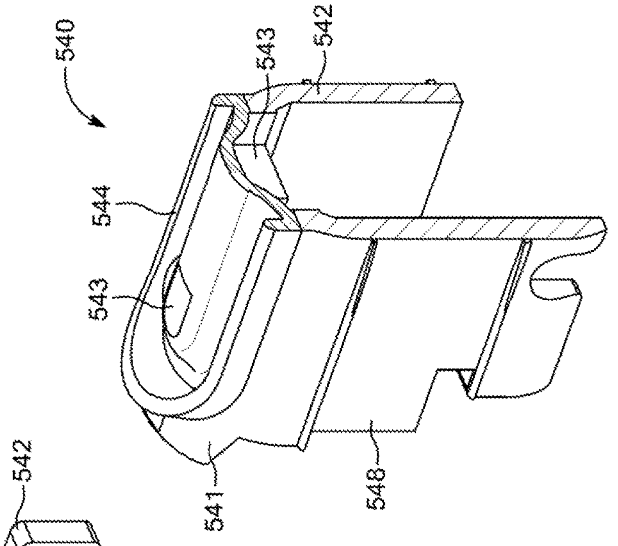
Figure 14J:
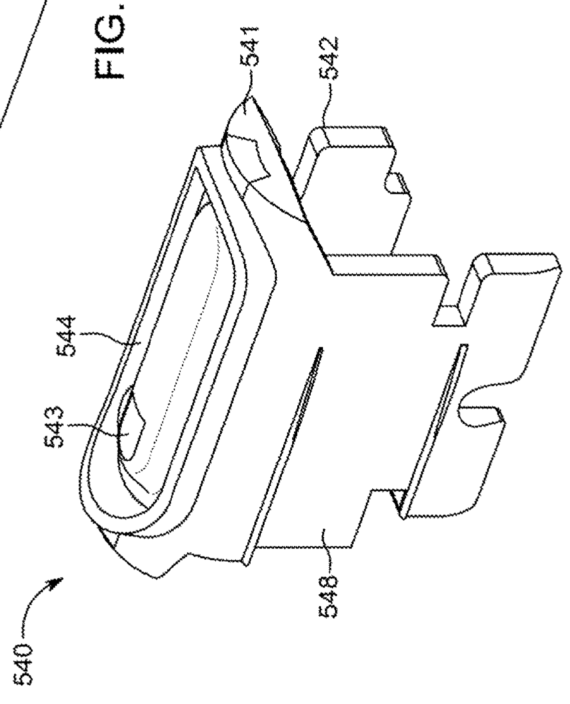
Figure 14L:
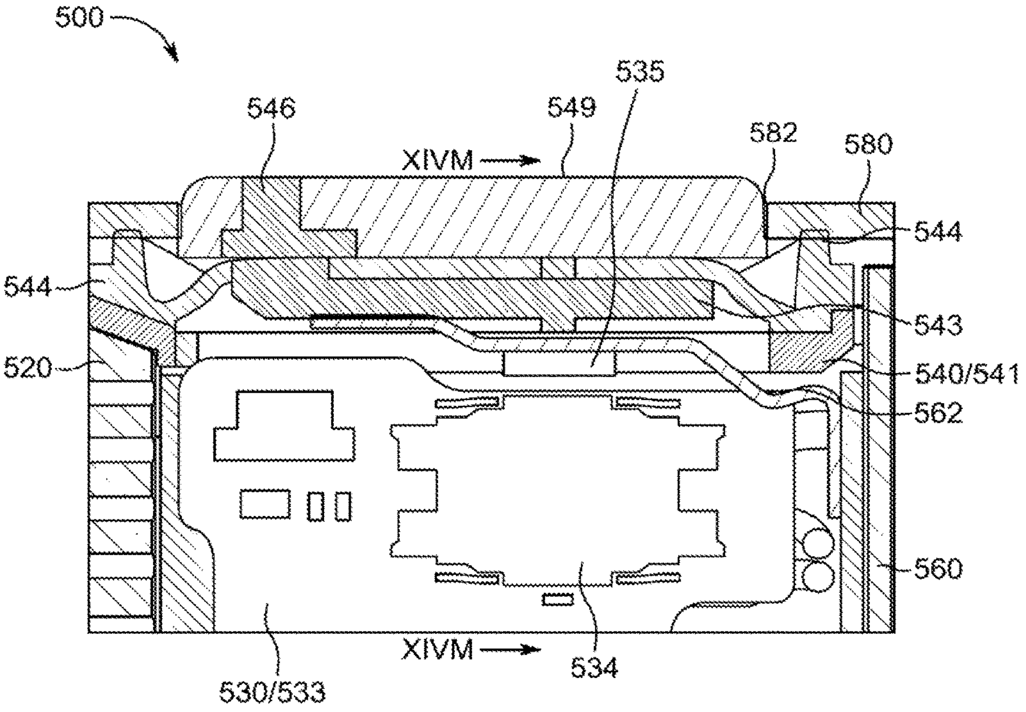
FIGS. 14L and 14M are various views of the power supply subassembly of FIGS. 9 and 13A-14K.
Figure 14M:
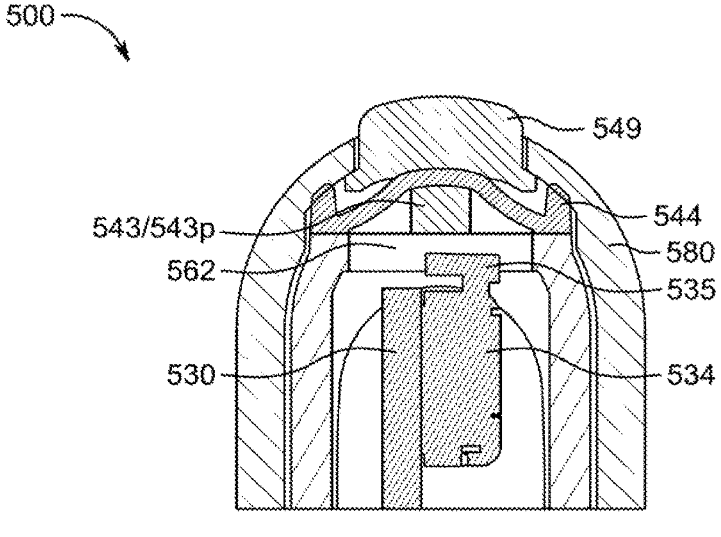

Next, as shown in FIGS. 13B and 13B', button carrier 540 may be moved downward into place about PCB 530, where at least a portion of top portion 541 of button carrier 540 may rest on power neckband joint 520, and/or where a front wing 542 of button carrier 540 may extend from top portion 541 of button carrier 540 and along and adjacent to a top surface of top power neckband joint component 522, and/or where a back wing 548 of button carrier 540 may extend from top portion 541 of button carrier 540 and along and adjacent to a back surface of back power neckband joint component 528. As shown in FIG. 13B, for example, front wing 542 may include a first slot 542*p* that may receive a portion of a protrusion 527*b* that may be extending out away from a surface of power neckband joint 520 for properly aligning and/or holding button carrier 540 in position with respect to power neckband joint 520. As shown in FIG. 13B', for example, back wing 548 may include a first slot 548*p* that may receive a portion of protrusion 529*p* that may be extending out away from a bottom surface of extension arm 529 of bottom power neckband joint component 528 of power neckband joint 520, and/or back wing 548 may include a second slot 548*sp* that may receive a portion of raised subprojection 529*sp* of projection 529*p*' of bottom power neckband joint component 528 of power neckband joint 520 for properly aligning and/or holding button carrier 540 in position with respect to power neckband joint 520. Therefore, power neckband joint 520 may include various locating, datum, and/or assembly features to help properly align, support, and/or couple different components of power supply subassembly 500 to power neckband joint 520. Then, as shown in FIGS. 13C-13D', button 549 may be positioned to extend out from opening 582 along a side surface of main power housing 580 and then neckband end opening 589 of main power housing 580 may be coupled to power neckband housing portion 510 about power neckband joint 520 to form the complete enclosure of power supply subassembly 500, such that at least a portion of button 549 and opening 582 may align with at least a portion of top portion 541 of button carrier 540.

As shown in FIGS. 14A-14M, button carrier 540 may not only include top portion 541, front wing 542, and back wing 548, where portion 541 and wings 542 and 548 may together be referred to herein as button carrier frame 547, but button carrier 540 may also include a plunger 543 and a gasket 544. Button carrier frame 547 may include a carrier frame opening 547*o* provided through top portion 541, while gasket 544 may be operative to rest on a top surface of top portion 541 for covering frame opening 547*o*, and while a gasket opening 545 may be provided through a portion of gasket 544. Plunger 543 may be positioned within frame opening 5470 underneath gasket 544 and may be operative to extend across gasket opening 545. Button carrier may be formed using any suitable material(s) and any suitable process(es). In some embodiments, at least a portion or the entirety of button carrier frame 547 may be molded during a first single shot molding process that may also include molding plunger 543, where such a first shot molding process may use a first material or first material combination, such as a clear or at least partially translucent plastic. Such a first single shot molding process may form both button carrier frame 547 and plunger 543 even though plunger 543 may be a distinct independent structure from button carrier frame 547 (e.g., plunger 543 may float between wings 542 and 548 under carrier frame opening 547*o* but may be held by a tool and suspended in place during the formation of button carrier 540. After molding button carrier frame 547 and plunger 543, gasket 544 may be molded onto and/or about button carrier frame 547 and onto and/or about plunger 543 during a second single shot molding process, such as using a second material or second material combination, such as any suitable TPE(s).

The structure of button carrier 540 may be operative to position plunger 543 along and/or against a top surface of a portion of bracket arm 562 including the free end of bracket arm 562, such that downward depression of gasket 544, such as by a user pressing on button 549 that may be position along a top surface of gasket 544, may push plunger 543 downward against bracket arm 562, which may actuate switch element 535 of switch component 534 positioned below bracket arm 562. Gasket 544 may be operative to provide spring/damper characteristics to deliver a tactile feel to a user interacting with button 549, while bracket arm 562 may be operative to bias plunger 543 and gasket 544 upwards away from switch component 534, where such bias may be overcome by a user's downward force on button 549. Gasket 544 may also be operative to provide a waterproof seal about opening 582 in main power housing 580 through which button 549 may be exposed and pushed downwardly by a user. Button 549 may include a translucent element 546 provided through an otherwise opaque button (e.g., button 549 may be formed by any suitable TPE(s) that may be similar to gasket 544, while translucent element 546 may be made by a clear plastic that may be similar to plunger 543). Together, plunger 543 and translucent element 546 may be operative to convey light from a light source of power supply subassembly 500 within main power housing 580 to a user of assembly 100 (e.g., when assembly 100 is powered on). For example, an LED on PCB 530 may be operative to shine light into a first portion of plunger 543, and plunger 543 may be operative as a light pipe to transport that light to a second portion of plunger 543 adjacent to translucent element 546 of button 549 that may then convey the light to the user.

Figure 15:
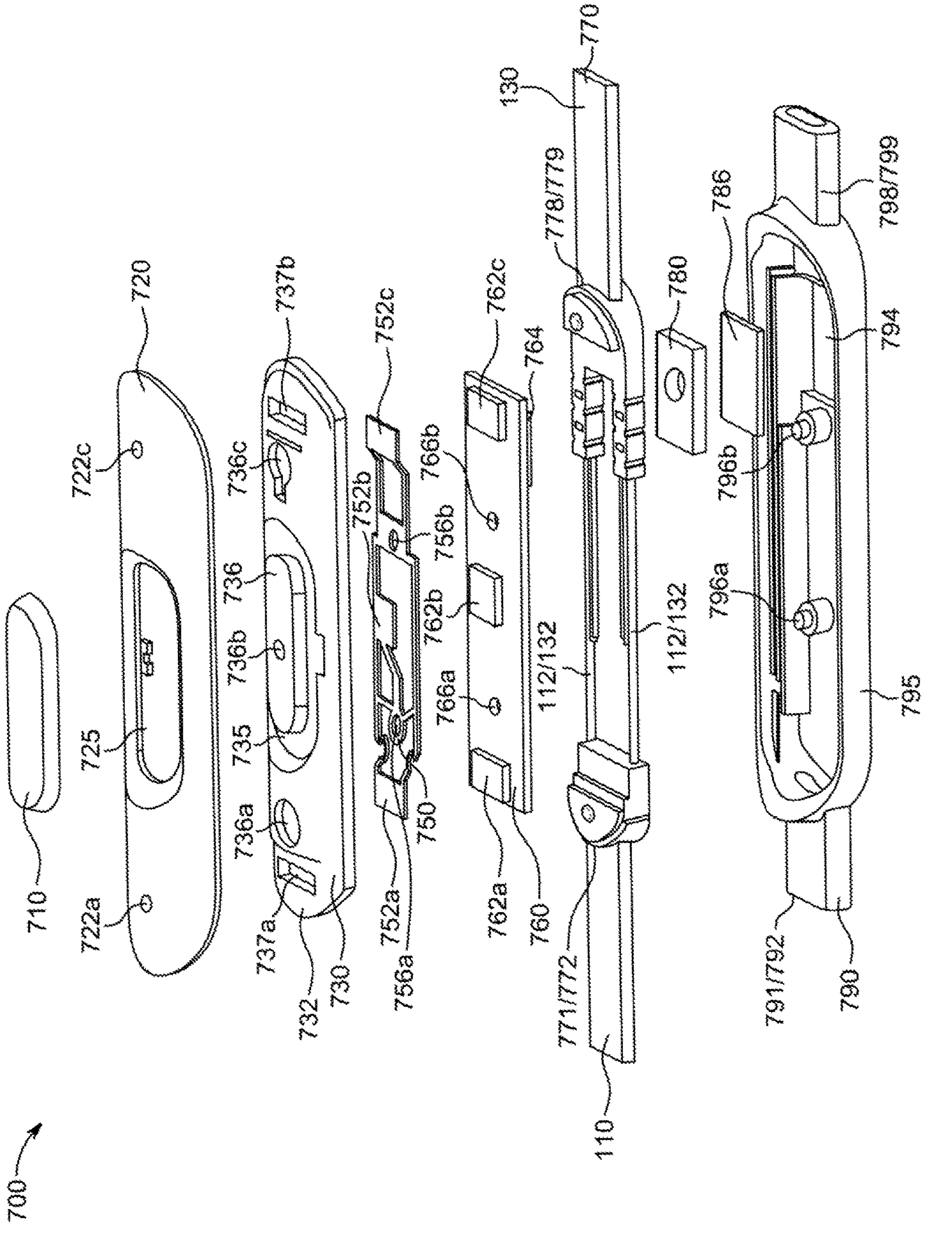
FIG. 15 is an exploded perspective view an input subassembly of the earphone assembly of FIGS. 1-1F.
Figure 15A:
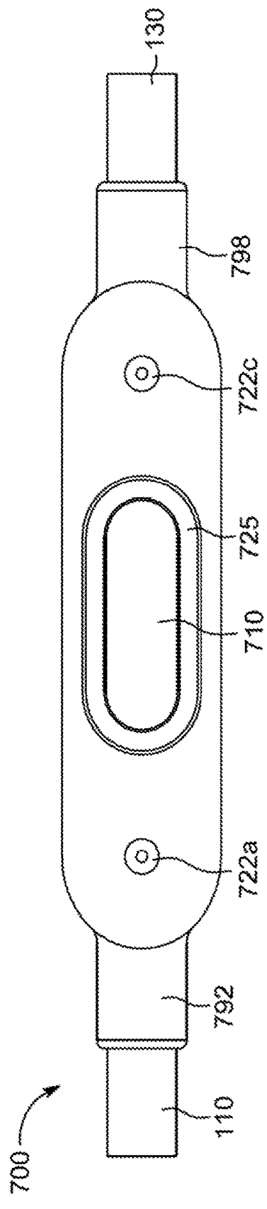
FIGS. 15A-15C are various views of the input subassembly of FIG. 15.
Figure 15B:
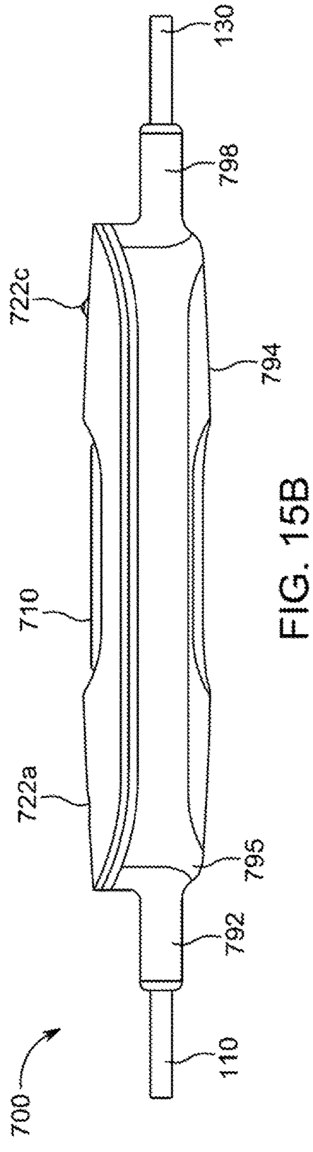
Figure 15C:
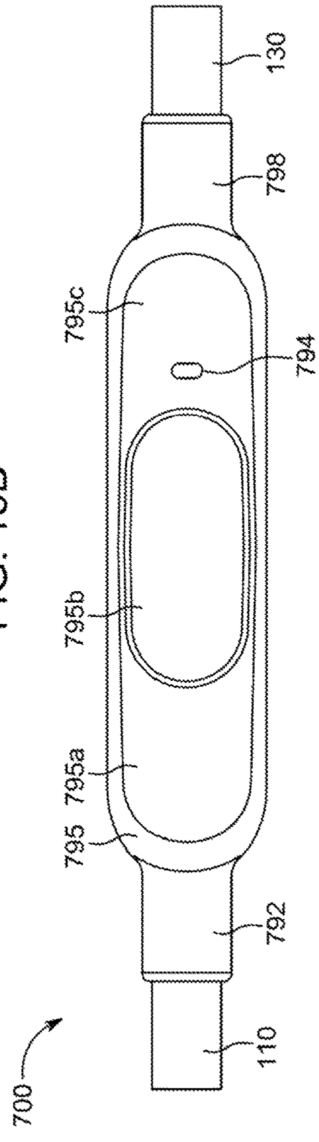
Figure 16A:
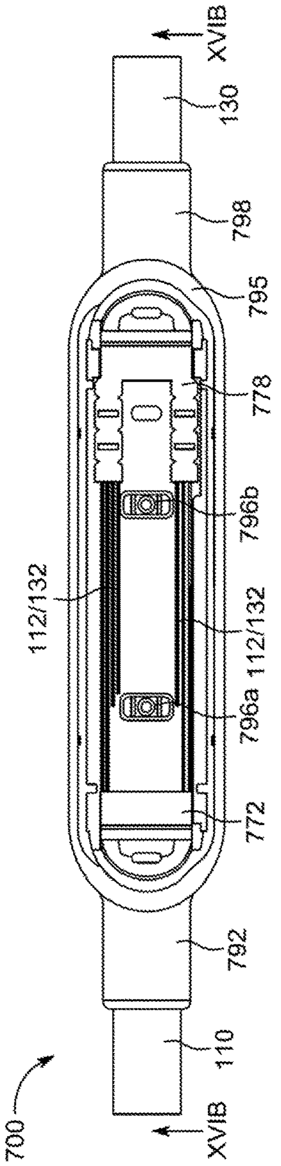
FIGS. 16A-16H are various views of the input subassembly of FIGS. 15-15C at various stages of assembly.
Figure 16B:
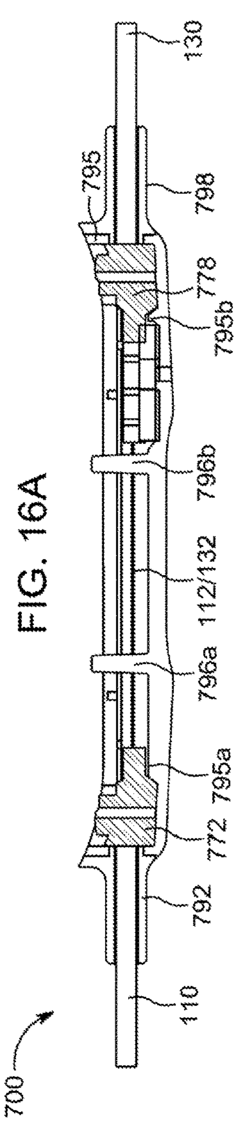
Figure 16C:
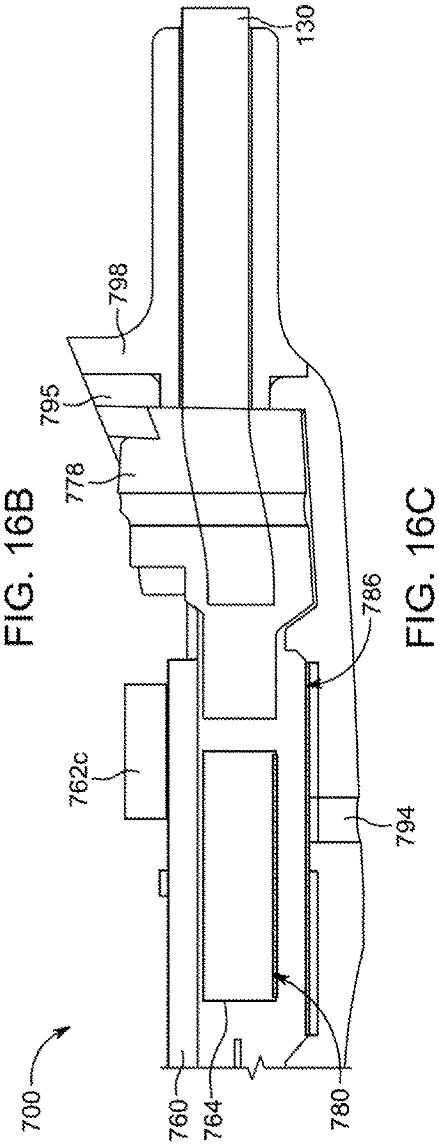
Figures 16D, 16E, 16F:
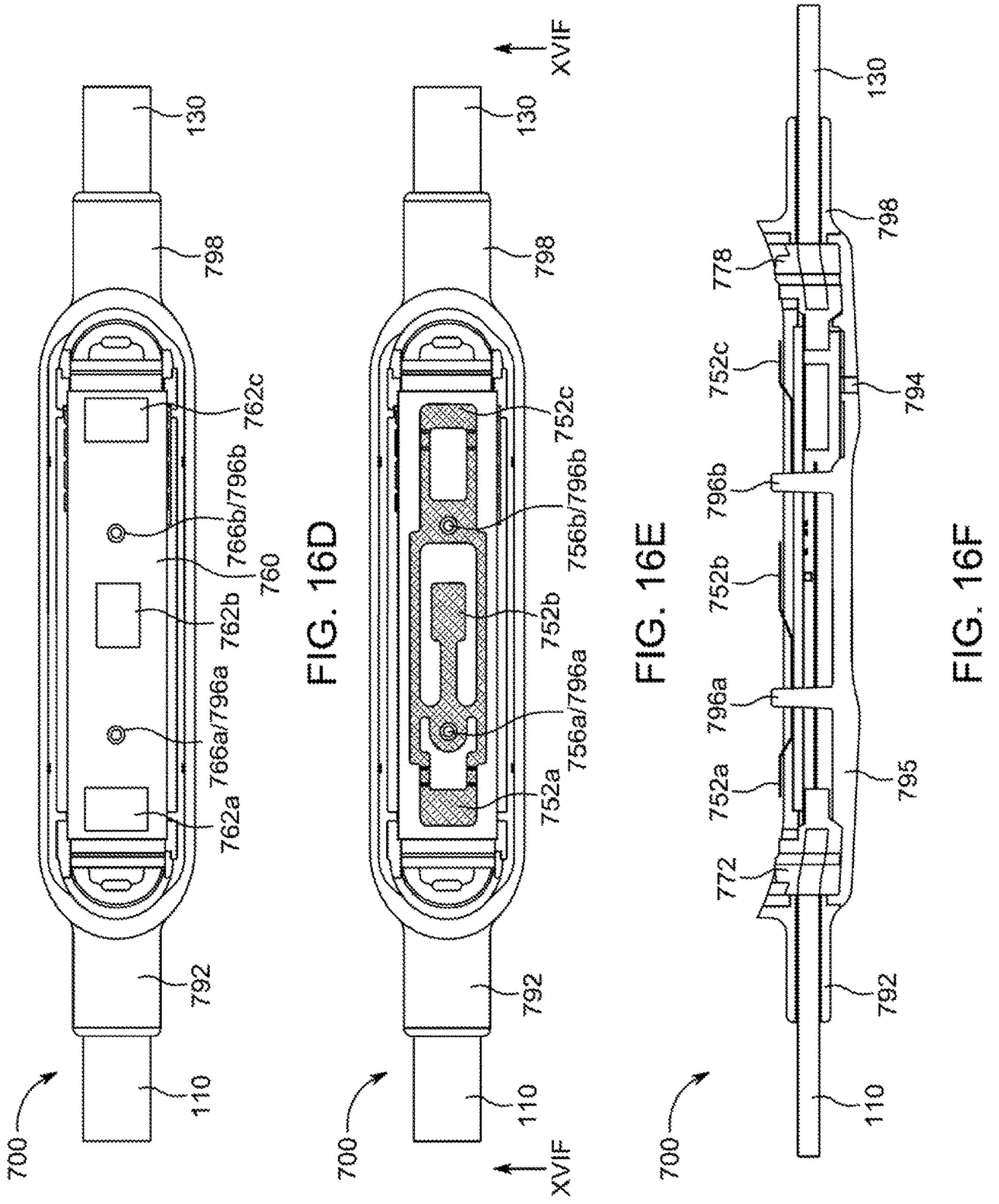
Figure 16G:
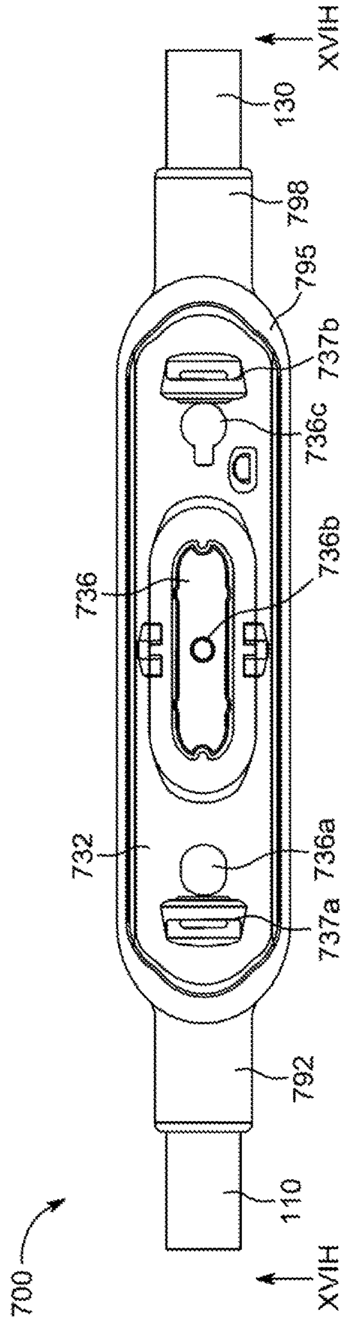
Figure 16H:
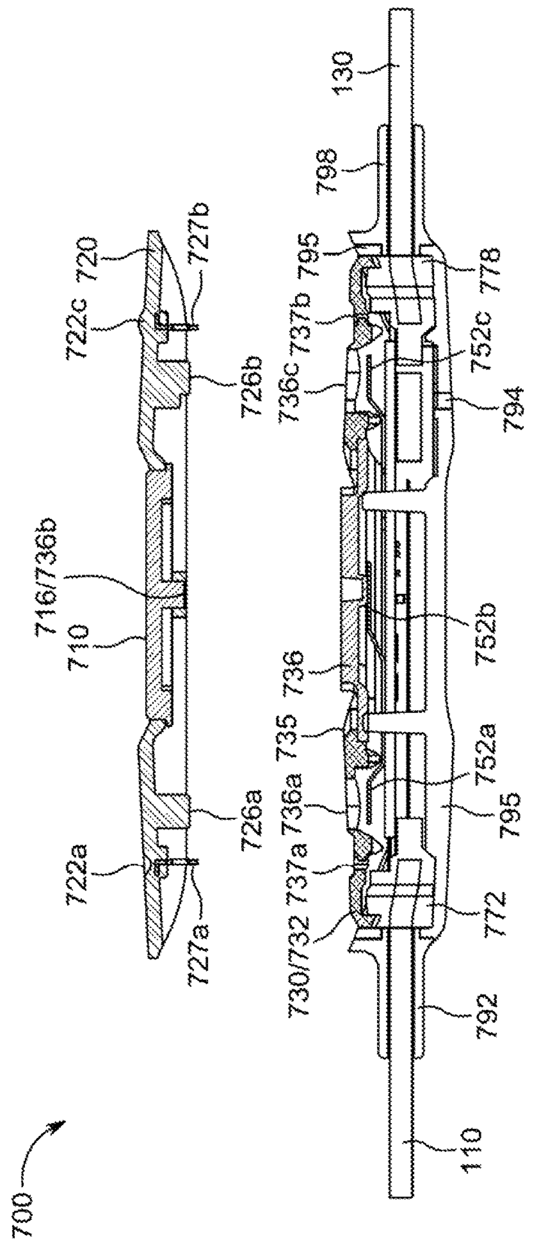

As shown in FIGS. 15-16H, for example, input subassembly 700 may include any suitable components for receiving user input commands for controlling assembly 100, such as a center button 710, a top housing 720, a cover 730, a spacer component 750, a PCB 760, a cable mount subassembly 770, a first microphone mesh 780, a second microphone mesh 786, and a bottom housing 790. Center button 710 may be positioned between top housing 720 and a top surface of cover 730, where a portion of center button 710 may be operative to extend through or at least be exposed by a center opening 725 through top housing 720 in order to receive a center button depression force on a top surface of center button 710 from a user of assembly 100. Spacer component 750 may be positioned between a bottom surface of cover 730 and a top surface of PCB 760, where spacer component 750 may include at least one pad, such as three pads 752*a*, 752*b*, and 752*c*, each of which may be suspended above a respective switch provided on a top surface of PCB 760, such as switches 762*a*, 762*b*, and 762*c*, such that spacer component 750 may be operative to provide a tactile feel to a user when the user provides a downward force on a particular portion of button 710 and/or front housing 720 that may exert a downward force on and/or through a particular portion of cover 730 that may exert a downward force on a particular pad of spacer component 750 that may actuate a particular switch on PCB 760. For example, when a user exerts a downward force on a first portion 722*a* of front housing 720, which may be identified by a depression downward into the top face of front housing 720, or when a user squeezes first portion 722*a* of front housing 720 and bottom housing 790 (e.g., a first portion 795*a* of bottom housing 790) together, then switch 762*a* may be actuated (e.g., via pad 752*a*). As another example, when a user exerts a downward force on button 710 through a second portion of front housing 720 (e.g., through opening 725 and through or via cover 730 (e.g., through recess 736*b* of structure 736 of cover 730)), or when a user squeezes button 710 and bottom housing 790 (e.g., a second portion 795*b* of bottom housing 790) together, then switch 762*b* may be actuated (e.g., via pad 752*b*). As yet another example, when a user exerts a downward force on a third portion 722*c* of front housing 720, which may be identified by nub extending upward from the top face of front housing 720, or when a user squeezes third portion 722*c* of front housing 720 and bottom housing 790 (e.g., a third portion 795*c* of bottom housing 790) together, then switch 762*c* may be actuated (e.g., via pad 752*c*).

Conductors 112 of cable subassembly 110 may extend from earbud subassembly 200 through a left end opening 791 in a left cable external strain relief structure 792 of bottom housing 790 and then through a left end opening 771 in a left cable internal structure 772 of cable mount subassembly 770 for providing strain relief to conductors 112, while conductors 132 of cable subassembly 130 may extend from logic subassembly 600 through a right end opening 799 in a right cable external strain relief structure 798 of bottom housing 790 and then through a right end opening 779 in a right cable internal structure 778 of cable mount subassembly 770 for providing strain relief to conductors 132. Each one of conductors 112 may be electrically coupled within input subassembly 700 to a respective contact of PCB 760 or may be electrically coupled to or integral with a respective conductor 132 of cable subassembly 130, while, similarly, each one of conductors 132 may be electrically coupled within input subassembly 700 to a respective contact of PCB 760 or may be electrically coupled to or integral with a respective conductor 112 of cable subassembly 110. A main housing structure 795 of bottom housing 790 may extend between and/or about left cable external strain relief structure 792 and right cable external strain relief structure 798 to combine to define an interior space of bottom housing 790 within which cable mount subassembly 770 may be positioned such that left end opening 771 in left cable internal structure 772 may align with and be against left end opening 791 in a left cable external strain relief structure 792 and such that right end opening 779 in a right cable internal structure 778 may align with and be against right end opening 799 in right cable external strain relief structure 798. The bottom surface of PCB 760 may be positioned against a top surface of cable mount subassembly 770 and/or bottom housing 790 such that a microphone 764 provided on the bottom surface of PCB 760 may face a microphone opening 794 through a bottom surface of bottom housing 790, where first microphone mesh 780 and/or second microphone mesh 786 may be positioned between microphone 764 and microphone opening 794.

Center button 710 may be provided by any suitable material(s) using any suitable procedure(s), such as any suitable PC(s). Top housing 720 may be provided by any suitable material(s) using any suitable procedure(s), such as any suitable PC(s), including the same material(s) as button 710. One or more retention features, such as retention features 727*a* and 727*b* on the bottom surface of top housing 720, may be formed at top housing 720, using any suitable procedures, such as insert-molded sheet metal snap retention features (e.g., top housing 720 may be molded about metal retention features 727*a* and 727*b* (e.g., protruding lips of respective snaps)). Cover 730 may be provided by any suitable material(s) using any suitable procedure(s), such as a double shot structure of any suitable PC(s) and any suitable TPE(s). In some embodiments, at least an outer structure 732 of cover 730 may be molded during a first single shot molding process, where such a first shot molding process may use a first material or first material combination, such as any suitable PC(s), including the same material(s) as button 710 and/or as top housing 720, where an opening 735 may be provided through outer structure 732 between its top and bottom surfaces. After molding outer structure 732, an inner structure 736 of cover 730 may be molded onto outer structure 732 within and across opening 735 during a second single shot molding process, such as using a second material or second material combination, such as any suitable TPE (s), which may be softer than a material of outer structure 732 and/or button 710 and/or top housing 720 such that inner structure 736 may be operative to provide a cushion or bounce back when button 710 is depressed (e.g., to deliver a more natural feel to a user during use). As an alternative, inner structure 736 may be molded during a first single shot molding process and then outer structure 732 may be molded with respect to inner structure 736. One or more retention features, such as retention features 737*a* and 737*b* into the top surface of or through outer structure 732 of cover 730, may be formed at cover 730, using any suitable procedures, such as insert-molded sheet metal snap retention features (e.g., retention features 737*a* and 737*b* may be formed into the top surface of outer structure 732 (e.g., indentations or grooves of respective snaps)). Spacer component 750 may be provided by any suitable material(s) using any suitable procedure(s), such as metal.

PCB 760 may be provided by any suitable material(s) using any suitable procedure(s), such as a hydrophobic coating that may be applied over any external surface(s) of PCB 760 to protect PCB function during water and/or sweat or other fluid ingress, where such a coating may be nano shield coating (e.g., 1H,1H,2H,2H-HEPTADECAFLUORODECYL ACRYLATE (e.g., Nanofics 120 by Europlasma NV of Belgium) of the like). Cable mount subassembly 770 may be provided by any suitable material(s) using any suitable procedure(s), such as a double shot structure of any suitable PC(s) and any suitable PP(s). In some embodiments, at least a portion of conductors 112 and at least a portion of conductors 132 may be over molded during a first shot molding process, where such a first shot molding process may use a first material or first material combination, such as any suitable PC(s). Also, at least a portion of conductors 112 and/or at least a portion of conductors 132 may be overmolded along with at least a portion of left cable internal structure 772 and at least a portion of right cable internal structure 778 that may be molded during a second single shot molding process, where such a second shot molding process may use a second material or second material combination, such as any suitable PP(s) that may provide suitable rigidity for the structure of cable mount subassembly 770 while also providing suitable strain relief to one or more of connector subassemblies 110 and 130. Bottom housing 790 may be provided by any suitable material(s) using any suitable procedure(s), such as a double shot structure of any suitable PC(s) and any suitable TPE(s). In some embodiments, at least main housing structure 795 of bottom housing 790 may be molded during a first shot molding process, where such a first shot molding process may use a first material or first material combination, such as any suitable PC(s). Also, at least a portion of left cable external strain relief structure 792 and/or at least a portion of right cable external strain relief structure 798 may be molded during a second single shot molding process, where such a second shot molding process may use a second material or second material combination, such as any suitable TPE(s) that may provide flexibility for any suitable strain relief to one or more of connector subassemblies 110 and 130.

First microphone mesh 780 may be provided by any suitable material(s) using any suitable procedure(s), such as any suitable precision woven and/or hydrophobic mesh for protecting microphone 764 (e.g., any Saatifil Acoustex material provided by SAATI of Milan, Italy), where first microphone mesh 780 may be coupled to a bottom surface of microphone 764 (see, e.g., FIG. 16C). Second microphone mesh 786 may be provided by any suitable material(s) using any suitable procedure(s), such as any suitable plastic polymer mesh that may be coated using any suitable hydrophobic coating, such as a coating provided by Europlasma of Belgium, that may be applied to the mesh via a vacuum process in a vacuum chamber, and then the coated mesh 786 may be coupled to a top surface of bottom housing 790 across microphone opening 794 (see, e.g., FIG. 16C).

As shown in FIGS. 16A-16C, once cable mount subassembly 770 has been formed about conductors 112 of cable subassembly 110 and conductors 132 of cable subassembly 130, free ends of conductors 112 may be passed out from opening 791 of left cable external strain relief structure 792 of bottom housing 790 and free ends of conductors 132 may be passed out from opening 799 of right cable external strain relief structure 798 of bottom housing 790 such that cable mount subassembly 770 may be fitted within an interior space of bottom housing 790. Various features provided along a top of a bottom surface of bottom housing 790 (e.g., features 795*a* and 795*b*) may interact with respective features on the bottom surface of left cable internal structure 772 and right cable internal structure 778 of cable mount subassembly 770 for holding cable mount subassembly 770 in a proper position within bottom housing 790. As also shown, one or more posts, such as first bottom housing post 796*a* and second bottom housing post 796*b*, may extend upwards from bottom housing 790 for interacting with other components of subassembly 700, where posts 796*a* and 796*b* may pass between internal structures 772 and 778 and conductors 112 and 132 of cable mount subassembly 770.

Then, as shown in FIG. 16D, PCB 760 may be positioned within assembly 700 such that first post 796*a* of bottom housing 790 may pass through a first opening 766*a* provided through PCB 760 (e.g., between switches 762*a* and 762*b*) and such that second post 796*b* of bottom housing 790 may pass through a second opening 766*b* provided through PCB 760 (e.g., between switches 762*b* and 762*c*). In some embodiments, any suitable adhesive (e.g., glue) or other coupling elements may be provided about some or the entirety of the peripheral (e.g., side surface) edge of PCB 760 to fix PCB 760 in its position of FIG. 16D to bottom housing 790 and/or cable mount subassembly 770. Then, as shown in FIGS. 16E and 16F, spacer component 750 may be positioned within assembly 700 such that first post 796*a* of bottom housing 790 may pass through a first opening 756*a* provided through spacer component 750 (e.g., between pads 752*a* and 752*b*) and such that second post 796*b* of bottom housing 790 may pass through a second opening 756*b* provided through spacer component 750 (e.g., between pads 752*b* and 752*c*). Then, in some embodiments, a top portion of first post 796*a* may be heat staked or otherwise fixed to spacer component 750 about first opening 756*a* and/or a top portion of second post 796*b* may be heat staked or otherwise fixed to spacer component 750 about second opening 756*b* to hold spacer component 750 in its position of FIGS. 16E and 16F (e.g., resting on top of PCB 760).

Then, as shown in FIGS. 16G and 16H, cover 730 may be positioned within assembly 700 such that first post 796*a* of bottom housing 790 may contact or be positioned to support a portion of a bottom surface of cover 730 and such that second post 796*b* of bottom housing 790 may contact or be positioned to support a portion of a bottom surface of cover 730. Then, any suitable adhesive (e.g., glue) or other coupling elements may be provided about some or the entirety of the peripheral (e.g., side surface) edge of cover 730 (e.g., of outer structure 732 of cover 730) to fix cover 730 in its position of FIGS. 16G and 16H to bottom housing 790 and/or cable mount subassembly 770. Then, as also shown in FIG. 16H, top housing 720 may be coupled to cover 730 in any suitable manner, such as by coupling (e.g., snapping) retention feature 727*a* of top housing 720 to retention feature 737*a* of cover 730 and by coupling (e.g., snapping) retention feature 727*b* of top housing 720 to retention feature 737*b* of cover 730, while button 710 may be positioned between cover 730 and top housing 720 so button 710 may partially extend out from or otherwise made be accessible to a user via opening 725 of top housing 720. When top housing 720 is coupled to cover 730, as shown, a first post 726*a* extending from a bottom surface of top housing 720 may be aligned with and/or extend at least partially through an opening 736*a* of cover 730 such that first post 726*a may be enabled to contact pad 752***a* for activating switch 762*a* when a user exerts a downward force on first portion 722*a* of front housing 720, and/or a second post 726*b* extending from a bottom surface of top housing 720 may be aligned with and/or extend at least partially through an opening 736*c* of cover 730 such that second post 726*b* may be enabled to contact pad 752*c* for activating switch 762*c* when a user exerts a downward force on third portion 722*c* of front housing 720, and/or a post 716 extending from a bottom surface of button 710 may be aligned with and/or extend at least partially through a recess 736*b* of cover 730 such that post 716 may be enabled to contact pad 752*b* directly (or via cover 730 without a complete recess 736*b* (not shown)) for activating switch 762*b* when a user exerts a downward force on a top portion of button 710.

While there have been described earphone assemblies with multiple subassembly housings, it is to be understood that many changes may be made therein without departing from the spirit and scope of the disclosure. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

Therefore, those skilled in the art will appreciate that the invention can be practiced by other than the described embodiments, which are presented for purposes of illustration rather than of limitation.

What is claimed is:

1. An electronic assembly to be worn about a user's neck, the electronic assembly comprising:

a first subassembly comprising:

a first housing defining a first internal space;

a first electronic component positioned at least partially within the first internal space; and a first joint component coupled to the first housing;

a second subassembly comprising:

a second housing defining a second internal space;

a second electronic component positioned at least partially within the second internal space; and a second joint component coupled to the second housing; and a cable assembly comprising:

an electrical conductor extending between a first electrical conductor end and a second electrical conductor end; and a memory cable component extending between a first memory cable component end and a second memory cable component end, wherein:

the first electrical conductor end is electrically coupled to the first electronic component within the first internal space;

the first memory cable component end is coupled to the first joint component;

the second electrical conductor end is electrically coupled to the second electronic component within the second internal space;

the second memory cable component end is coupled to the second joint component; and at least a portion of the memory cable component is configured to define a curved shape between the first memory cable component end and the second memory cable component end absent any external force applied to the electronic assembly.

2. The electronic assembly of claim 1, wherein the first memory cable component end is coupled to the first joint component within the first internal space.

3. The electronic assembly of claim 2, wherein the second memory cable component end is coupled to the second joint component within the second internal space.

4. The electronic assembly of claim 1, wherein a first portion of the electrical conductor between the first electrical conductor end and the second electrical conductor end extends through the first joint component.

5. The electronic assembly of claim 4, wherein a second portion of the electrical conductor between the first electrical conductor end and the second electrical conductor end extends through the second joint component.

6. The electronic assembly of claim 1, wherein the memory cable component comprises at least one nitinol steel wire.

7. The electronic assembly of claim 1, wherein a projection of the first joint component extends through a slot in the first electronic component.

8. The electronic assembly of claim 7, wherein the first memory cable component end is held against a feature of the projection.

9. An electronic assembly to be worn about a user's neck, the electronic comprising:

a subassembly comprising:

a housing defining an internal space;

an electronic component positioned at least partially within the internal space; and a joint component coupled to the housing; and a cable assembly comprising:

an electrical conductor extending between a first electrical conductor end and a second electrical conductor end; and a memory cable component extending between a first memory cable component end and a second memory cable component end, wherein:

the first electrical conductor end is electrically coupled to the electronic component within the internal space;

the first memory cable component end is coupled to the joint component; and at least a portion of the memory cable component is configured to maintain a defined shape along at least a portion of a length of the memory cable component between the first memory cable component end and the second memory cable component end absent any external force applied to the memory cable component.

10. The electronic assembly of claim 9, further comprising an other subassembly comprising:

an other housing defining an other internal space;

an other electronic component positioned at least partially within the other internal space; and an other joint component coupled to the other housing, wherein:

the second electrical conductor end is electrically coupled to the other electronic component within the other internal space; and the second memory cable component end is coupled to the other joint component.

11. The electronic assembly of claim 10, wherein:

the electronic component comprises a battery; and the other electronic component comprises an antenna.

12. The electronic assembly of claim 9, wherein the electronic component comprises a battery.

13. The electronic assembly of claim 9, wherein the electronic component comprises an antenna.

14. The electronic assembly of claim 9, wherein the defined shape is a curved shape.

15. The electronic assembly of claim 9, wherein the first memory cable component end is coupled to the joint component within the internal space.

16. The electronic assembly of claim 9, wherein a portion of the electrical conductor between the first electrical conductor end and the second electrical conductor end extends through the joint component.

17. The electronic assembly of claim 9, wherein:
- a projection of the joint component extends through a slot in the electronic component; and
- the first memory cable component end is held against a feature of the projection.

18. An electronic assembly to be worn about a user's neck, the electronic comprising:
- a subassembly comprising:
  - a housing defining an internal space;
  - an electronic component positioned at least partially within the internal space; and
  - a joint component coupled to the housing; and
- a cable assembly comprising:
  - an electrical conductor extending between a first electrical conductor end and a second electrical conductor end; and
  - a memory cable extending between a first memory cable end and a second memory cable end, wherein:
    - the first electrical conductor end is electrically coupled to the electronic component;
    - a first portion of the memory cable between the first memory cable end and the second memory cable end extends through the joint component;
    - a second portion of the memory cable between the first memory cable end and the first portion of the memory cable extends along and against a surface of the joint component;
    - the surface of the joint component is perpendicular to a direction in which the first portion of the memory cable extends through the joint component; and
    - at least a third portion of the memory cable component between the first portion of the memory cable and the second memory cable end is configured to maintain a defined shape along at least a portion of a length of the memory cable component between the first portion of the memory cable and the second memory cable component end.

19. The electronic assembly of claim 18, wherein:
- the second portion of the memory cable extends along and against an other surface of the joint component; and
- the other surface of the joint component is perpendicular to the direction in which the first portion of the memory cable extends through the joint component; and
- the surface of the joint component is perpendicular to the other surface of the joint component.

20. The electronic assembly of claim 19, wherein the surface of the joint component is within the internal space.

* * * * *